US012261431B2

(12) United States Patent
Oguz et al.

(10) Patent No.: US 12,261,431 B2
(45) Date of Patent: Mar. 25, 2025

(54) ELECTROSTATIC DISCHARGE (ESD) PROTECTION IN RADIO FREQUENCY (RF) SWITCH CIRCUITRY

(71) Applicant: Analog Devices International Unlimited Company, Limerick (IE)

(72) Inventors: Alp Oguz, Istanbul (TR); Turusan Kolcuoglu, Istanbul (TR); Celal Avci, Istanbul (TR); Atilim Ergul, Istanbul (TR)

(73) Assignee: Analog Devices International Unlimited Company, Limerick (IE)

( * ) Notice: Subject to any disclaimer, the term of this patent is extended or adjusted under 35 U.S.C. 154(b) by 364 days.

(21) Appl. No.: 17/815,883

(22) Filed: Jul. 28, 2022

(65) Prior Publication Data

US 2024/0039276 A1 Feb. 1, 2024

(51) Int. Cl.
*H02H 9/04* (2006.01)
*H01L 27/02* (2006.01)
*H03K 17/693* (2006.01)

(52) U.S. Cl.
CPC ......... *H02H 9/046* (2013.01); *H01L 27/0266* (2013.01); *H03K 17/693* (2013.01)

(58) Field of Classification Search
CPC ............. H02H 9/046; H03K 17/04123; H03K 17/693; H01L 27/0266; H01L 27/0251
See application file for complete search history.

(56) References Cited

U.S. PATENT DOCUMENTS

| | | | |
|---|---|---|---|
| 9,685,949 B2 | 7/2017 | Yamamoto et al. | |
| 10,354,994 B2 | 7/2019 | Robbins et al. | |
| 2009/0040678 A1 | 2/2009 | Yang et al. | |
| 2015/0145052 A1* | 5/2015 | Shapiro | H01L 27/027 438/155 |
| 2018/0167062 A1* | 6/2018 | Shanjani | H03K 17/04123 |
| 2019/0140688 A1* | 5/2019 | Tombak | H01Q 1/50 |
| 2020/0044642 A1* | 2/2020 | Shanjani | H03K 17/04123 |
| 2021/0143809 A1* | 5/2021 | Shanjani | H03K 17/04123 |
| 2021/0407990 A1* | 12/2021 | Dundigal | G06F 30/3953 |
| 2023/0140958 A1* | 5/2023 | Shanjani | H03K 17/04123 327/374 |

FOREIGN PATENT DOCUMENTS

WO WO 2022/005832 A1 1/2022

OTHER PUBLICATIONS

Office Action issued in German Patent Application No. 1020231192566, dated Jun. 11, 2024.

* cited by examiner

*Primary Examiner* — Jared Fureman
*Assistant Examiner* — Nicolas Bellido
(74) *Attorney, Agent, or Firm* — Knobbe, Martens, Olson & Bear, LLP

(57) ABSTRACT

Systems, devices, and methods related to electrostatic discharge (ESD) protection in radio frequency (RF) switch circuitry are provided. An electrostatic discharge (ESD)-protected radio frequency (RF) switch circuitry includes a common port; at least one terminal port; a switch circuitry coupled between the common port and the at least one terminal port, wherein the switch circuitry comprises one or more transistors connected in a stacked configuration; and a first ESD protection circuitry coupled between a gate of a first transistor of the one or more transistors and a driver circuitry for the first transistor.

20 Claims, 15 Drawing Sheets

ELECTROSTATIC DISCHARGE (ESD) PROTECTION IN RADIO FREQUENCY (RF) SWITCH CIRCUITRY

TECHNICAL FIELD OF THE DISCLOSURE

The present disclosure generally relates to electronics, and more particularly to electrostatic discharge (ESD) protection in radio frequency (RF) switch circuitry.

BACKGROUND

Radio systems are systems that transmit and receive signals in the form of electromagnetic waves in the RF range of approximately 3 kilohertz (kHz) to 300 gigahertz (GHz). Radio systems are commonly used for wireless communications, with cellular/wireless mobile technology being a prominent example, but may also be used for cable communications such as cable television. In both of these types of systems, linearity of various components therein plays a crucial role.

RF switches are commonly used in radio transceivers and wireless communication systems to route RF signals through transmission paths. In one example, an RF system, such as a mobile device or a base station, may include an antenna switch module implemented using RF switches. The antenna switch module can be used to electrically connect an antenna to a particular transmit or receive chain of the system, thereby allowing multiple components to access the antenna. In another example, an RF system may include multimode RF frontend modules with multiple RF chains (e.g., with power amplifiers, filters, mixers, etc.) and may include RF switches to connect a transmit chain or a receive chain to a particular RF chain. In general, RF switches may be used to selectively route signals among RF components and/or RF subsystems.

ESD problems are increasing in the electronics and semiconductor industry because of the market trend towards higher power, faster switching, and smaller integrated circuit (IC) devices. ESD is a transient discharge of static charge between two objects at different electrostatic potentials either through direct contact or an induced electric field. ESD can occur in various conditions, for example, when a charged human body touches an IC, when a charged IC touches a grounded surface, when a charged machine touches an IC, and/or when an electrostatic field induces a voltage across a dielectric sufficient to break it down. ESD can have serious detrimental effects on semiconductor ICs and/or electronic devices. For instance, ESD-induced failures in semiconductors can be seen in the form of leakage, short, burnout, contact damage, gate oxide rupture, and/or resistor-metal interface damage. Accordingly, all IC devices and/or circuits are required to satisfy certain ESD ratings.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
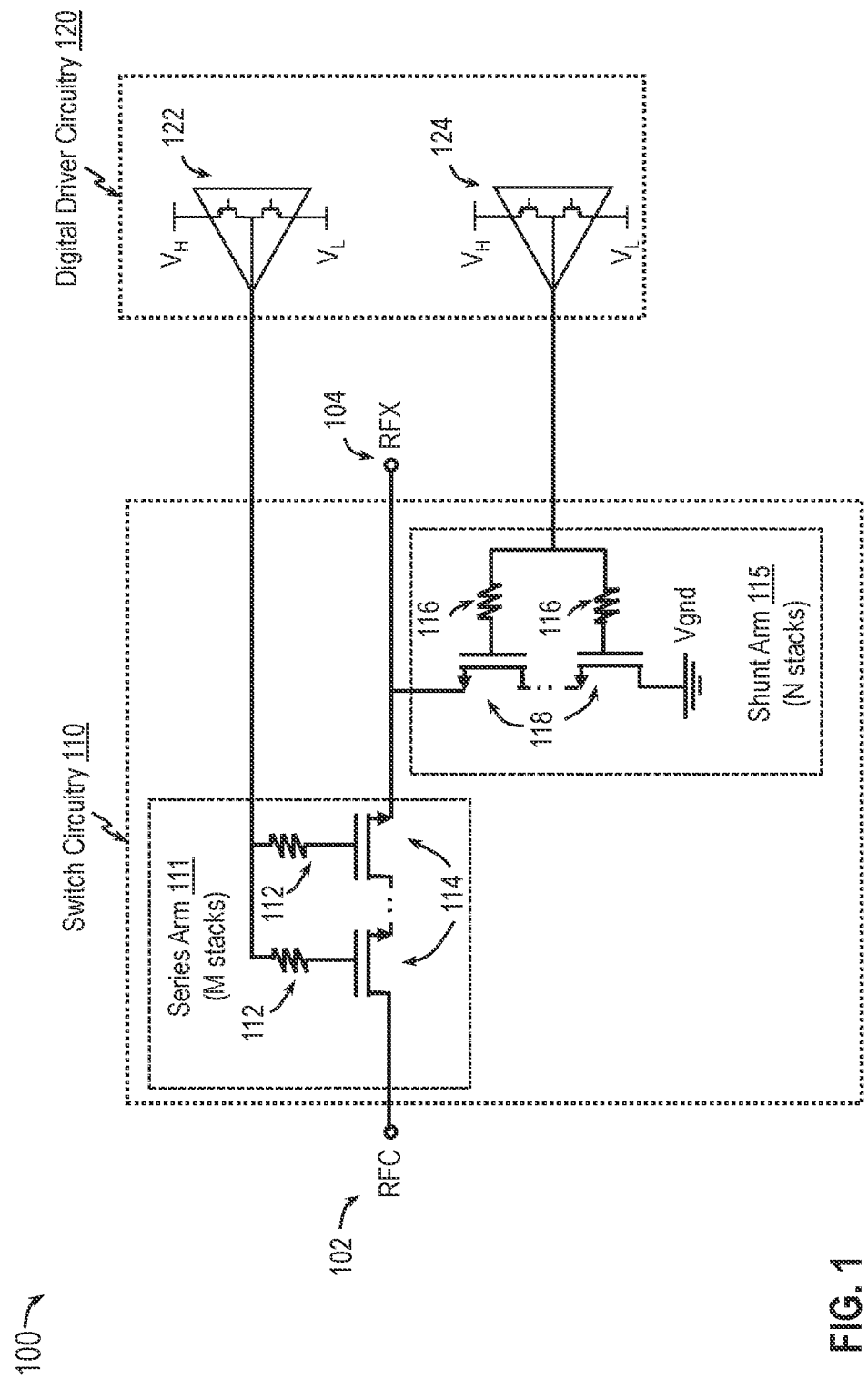
FIG. 1 is a schematic diagram illustrating an exemplary radio frequency (RF) switch circuitry.

The systems, methods and devices of this disclosure each have several innovative embodiments, no single one of which is solely responsible for all of the desirable attributes disclosed herein. Details of one or more implementations of the subject matter described in this specification are set forth in the description below and the accompanying drawings.

Typically, RF switch devices are self-protecting in terms of ESD owing to their circuit architectures. In this regard, an RF switch device may include at least two signal ports (or circuit pins), for example, a common port and a terminal port, in series with transistors connected in a stacked configuration therebetween, and the circuit pins are connected to the sources and drains of the transistors. The RF switch device may also include a shunt path with transistors connected in a stacked configuration between the terminal port and ground. When an ESD transient (or ESD zap) occurs, for example, between the common port and ground, the transistors in the path may start to conduct through their parasitic bipolar junctions (BJTs), causing each of transistors in the path to have a certain drain-source voltage (Vds). As such, the peak voltage at the common port may be clamped. If the transistors are large enough to thermally tolerate the power dissipated during the ESD transient and the gate oxides of the transistors are not exposed to voltage stresses that may breakdown the oxide, the device can endure the ESD transient. For the gate oxides not to breakdown, the gate-source voltages (Vgs) and/or the gate-drain voltages (Vgd) of the transistors have to be sufficiently small. Additionally or alternatively, the gates of the transistors have to be effectively floating during the duration of the ESD transient (or ESD pulse) such that the gate voltages may follow the source and drain voltages and therefore Vgs and Vgd may not increase significantly regardless of the clamp voltage.

The gates of the transistors in each of the series path and shunt path may be coupled to a respective driver circuitry via resistors (which may be referred to as gate resistors). The driver circuitry may control the switching of the transistors. For a slow-switching RF switch device, the gate resistors can have a high resistance value thereby providing a large gate discharge time constant (e.g., in the order of microseconds (us)). For instance, the large gate discharge time constant may be longer than the duration of an ESD pulse or transient (e.g., in the order of hundreds of nanoseconds (ns)), and thus the gates can be effectively "floating" (e.g., decoupled from a respective driver) during the ESD pulse.

The number of transistors in the series path and/or in the shunt path may be dependent on the power of the signals on which the RF switch device operates. In general, the number of transistors in the series path and/or in the shunt path may be greater for operating on higher-power signals than for operating on lower-power signals. Generally, the ESD self-protection discussed above may hold for low-power and/or high-power switches as long as the gate discharge time constant is longer than an ESD pulse duration. In some examples, low-power switches may operate on signals having a power between about 24 to 27 decibel-milliwatt (dBm) and high-power switches may operate on signals having a power greater than about 27 dBm or 30 dBm.

For high-power, fast-switching RF switches, the ESD self-protection discussed above may not hold. For instance, to support the high signal power, the number of transistors in the series path and/or in the shunt path may be large, causing the clamped voltage to be high (e.g., higher than a voltage that the gate oxide can tolerate) during an ESD transient. Further, to provide fast switching, the gate resistors have to be of a smaller resistance value, causing the gate discharge time constant to be comparable to (or shorter than) the duration of an ESD pulse. As such, the gate voltages may follow the drain and/or source voltages initially and quickly discharge before the end of the ESD pulse duration. Hence, Vgs and Vgd may increase significantly within the ESD pulse duration, causing the gate oxides to experience a high ESD voltage and breaks down.

Accordingly, there is a need to add ESD protection circuitries to high-power, fast-switching RF switches. However, using conventional auxiliary ESD protection circuitries along the RF signal path may be undesirable due to the performance limiting nature of ESD protection circuitries. Further, ESD protection circuitries may have nonlinear characteristics (e.g., nonlinear capacitances) that may be difficult to characterize and model in simulation.

As used herein, a slow-switching RF switch may refer to an RF switch with a gate discharge time constant longer than an ESD pulse, whereas a fast-switching RF switch may refer to an RF switch with a gate discharge time constant comparable to (or shorter) than an ESD pulse.

The present disclosure describes mechanisms for providing ESD-protection to high-power, fast-switching RF switch circuitries without using any auxiliary ESD-protection circuitries on the RF signal path. Instead, the disclosed embodiments utilize an ESD-protection circuitry to decouple (or "float") the gates of the transistors in the RF switch circuitries during an ESD event so that the gate voltages can follow the drain and source voltages of the transistors. In this way, Vgs and Vgd may be small, and thus gate oxide stress can be prevented. During normal operation, the disclosed ESD-protection circuitry may operate as a pass gate, and thus may not affect the normal operation of the RF switch circuitries.

In an aspect of the present disclosure, an ESD-protected RF switch circuitry (or device) may include a common port, at least one terminal port, and a switch circuitry coupled between the common port and the terminal port. The switch circuitry may include one or more transistors connected in a stacked configuration. The transistors may be referred to as stacked transistors. The gates of the one or more transistors may be coupled to a driver circuitry that controls the switching of the one or more transistors. The ESD-protected RF switch circuitry may further include a first ESD protection circuitry coupled between at least a gate of a first transistor of the one or more transistors and the driver circuitry. During normal operation, the first ESD protection circuitry may pass or electrically couple a control voltage from the driver circuitry to the first transistor. During an ESD pulse duration, the first ESD protection circuitry may electrically decouple (or "float") the gate of the first transistor from the driver circuitry and thereby providing ESD protection to the first transistor. In some aspects, a gate discharge time constant of the first transistor may be shorter than the ESD pulse duration.

In some aspects, the switch circuitry may include a series arm between the common port and the terminal port, and the one or more transistors connected in the stacked configuration may be part of the series arm. In some aspects, the switch circuitry may include a shunt arm between the common port and the terminal port, and the one or more transistors connected in the stacked configuration may be part of the shunt arm. In general, the switch circuitry may include a series arm and/or a shunt arm, each including one or more transistors in a stacked configuration.

In some aspects, the first ESD protection circuitry may be a common ESD protection circuitry coupled to the gate of each of the one or more transistors (e.g., in the series arm or in the shunt arm). In other aspects, an individual ESD protection circuitry may be used to protect each of the one or more transistors during an ESD pulse duration. For instance, the first ESD protection circuitry may be an individual ESD protection circuitry for the first transistor, and the RF switch circuitry may include a second ESD protection circuitry coupled between a gate of a second transistor of the one or more transistors and the driver circuitry, where the second transistor is different than the first transistor.

The first ESD protection circuitry may generally include a network of transistors, resistors, and/or diodes. In some aspects, the first ESD protection circuitry may include a plurality of transistors (e.g., pass gate transistors) in a stacked configuration. In some aspects, the plurality of transistors may include complementary metal-oxide semiconductor (CMOS) transistors. In other aspects, the first ESD protection circuitry may include p-channel metal-oxide semiconductor (PMOS) only transistors. In yet other aspects, the first ESD protection circuitry may include n-channel metal-oxide semiconductor (NMOS) only transistors. In some aspects, the first ESD protection circuitry may further include a resistor connected in parallel with the plurality of transistors. In some aspects, the gates of the plurality of transistors (in the first ESD protection circuitry) may be coupled to a voltage source. In other aspects, the gates of the plurality of transistors (in the first ESD protection circuitry) may be coupled to a ground potential. In some aspects, the gate of each of the plurality of transistors (in the first ESD protection circuitry) may be coupled to a respective high-value resistor (e.g., in the order of megaohms) so that the transistors in the first ESD protection may also be decoupled (or "floating") during an ESD event. In some aspects, the plurality of transistors (in the first ESD protection circuitry) may be biased using a resistive ladder network.

The systems, schemes, and mechanisms described herein advantageously provide ESD protection in high-power, fast-switching RF switch arrangement or devices without including any ESD protection circuitries along RF signal paths. By including ESD circuitries to decouple or float the gates of the transistors in the series arm and/or in the shunt arm during an ESD event can allow the gate voltages to follow the source and/or drain voltages and thereby preventing gate oxide stresses at the transistors.

Example RF Switch Circuitry

FIG. 1 is a schematic diagram illustrating an exemplary RF switch circuitry 100. For simplicity of illustration and discussion, FIG. 1 illustrates the RF switch circuitry 100 including a common port 102 and one terminal port. However, the RF switch circuitry 100 can be scaled to include any suitable number of terminal ports (e.g., 2, 3, 4, 5 or more). In some instances, the common port 102 may be an input port, and the terminal port 104 may be an output port. In other instances, the common port 102 may be an output port, and the terminal port 104 may be an input port. The common port 102 may be referred to as an RFC port, the terminal port 104 may be referred to as an RFX port. The RF switch circuitry 100 may further include a switch circuitry 110 coupled between the common port 102 and the terminal port 104. The switch circuitry 110 may be driven or control by digital driver circuitry 120. When the RF switch circuitry 100 includes multiple terminal ports, the RF switch circuitry 100 may generally include one switch circuitry (e.g., the switch circuitry 110) between each terminal port and the common port 102, and each switch circuitry may be driven by respective digital driver circuitry (e.g., the digital driver circuitry 120).

As shown in FIG. 1, the switch circuitry 110 may include a series arm 111 coupled between the common port 102 and the terminal port 104. The series arm 111 may include transistors 114 (shown as N-type MOS (NMOS) devices) connected in series (in a stack configuration) operating as switches along the conducting path between the common port 102 and the terminal port 104. More specifically, the source terminal of one transistor 114 may be coupled to the drain terminal of an adjacent transistor 114. In some instances, the transistors 114 arranged in the stacked configuration in the series arm 111 may be referred to as stacked transistors and/or series transistors. Further, the gate terminal of each transistor 114 may be coupled to a driver circuitry 122 via a corresponding resistor 112. The drain and source voltages of a transistor 114 may be biased to a certain DC level, and the driver circuitry 122 may apply a pulse voltage to the gate terminal of the MOS device to cause the MOS device to operate as an opened switch or as a closed switch. To that end, when the gate source voltage (which may be represented by $V_{GS}$) is above a threshold level (which may be represented by $V_{th}$) specific to the transistor 114's characteristics, the transistor 114 may be turned-on (operating as a closed switch). Conversely, when the gate source voltage $V_{GS}$ of the transistor 114 is below the threshold $V_{th}$, the transistor 114 may be turned-off (operating as an opened switch).

In operation, to select the signal path from the common port 102 to the terminal port 104, the driver circuitry 122 (within the digital driver circuitry 120) may apply a logic high (e.g., above $V_{th}$) to the gates of the transistors 114 so that the transistors 114 in the series arm 111 are biased on (e.g., conducting). To deselect the signal path from the common port 102 to the terminal port 104, the driver circuitry 122 may apply a logic low (e.g., below $V_{th}$) to the gates of the transistors 114 so that the transistors 114 in the series arm 111 are biased off (e.g., non-conducting) to decouple the unselected terminal port 104 from the common port 102.

To provide better isolation when the path between the common port 102 and the terminal port 104 is unselected, the switch circuitry 110 may further include transistors 118 (shown as NMOS devices) connected in series (in a stack configuration) operating as switches along the shunt arm 115. The transistors 118 may also be referred to as stacked transistors and/or shunt transistors 118. The transistors 118 may be connected in substantially the same way as the transistors 114. The gate terminal of each transistor 118 may be coupled to a driver circuitry 124 (within the digital driver circuitry 120) via a corresponding resistor 116. The control voltage signal for each transistor 118 may be a complement of the control voltage signal for the transistors 114 along the conducting path in the switch circuitry 110. In this regard, the driver circuitry 124 may apply a logic low to the gate terminals of the transistors 118 while the driver circuitry 122 applies a logic high to the gate terminals of the transistors 114 (to select the terminal port 104 for the switch). Conversely, the driver circuitry 124 may apply a logic high to the gate terminals of the transistors 118 while the driver circuitry 122 applies a logic low to the gate terminals of the transistors 114 (to deselect the terminal port 104 for the switch). In some aspects, the driver circuitries 122 and 124 may each operate between a high voltage rail $V_H$ and a low voltage rail $V_L$. The voltage rails $V_H$ and $V_L$ may generally be set to any suitable voltage levels. In some examples, $V_H$ may be set to about 3.3V and $V_L$ may be set to about −2.5V.

While FIG. 1 illustrates the switching circuitry 110 utilizing NMOS devices (e.g., the transistors 114 and 118) for switching, aspects are not limited thereto. For instance, the switching circuitry 110 may implement switches using any suitable types of transistors (e.g., P-type MOS (PMOS) devices, positive-negative-positive (PNP) transistors, or negative-positive-negative (NPN) transistors). Further, the switch circuitry 110 may generally include any suitable number of transistors 114 (e.g., 1, 2, 3, 4, 5 or more) in a stacked configuration along the series arm 111 (the conducting path) and/or any suitable number of transistors 118 (e.g., 1, 2, 3, 4, 5 or more) in a stacked configuration along the shunt arm 115. For instance, the series arm 111 may include M stacks (or M number) of transistors 114, and the shunt arm 115 may include N stacks (or N number) of transistors 118, where M and N may be positive integers. In general, the values of M and N may be dependent on the power of the signals on which the RF switch device operates. For instance, a large M value and/or a larger N value may be used for operating on signals with a higher power.

Figure 2:
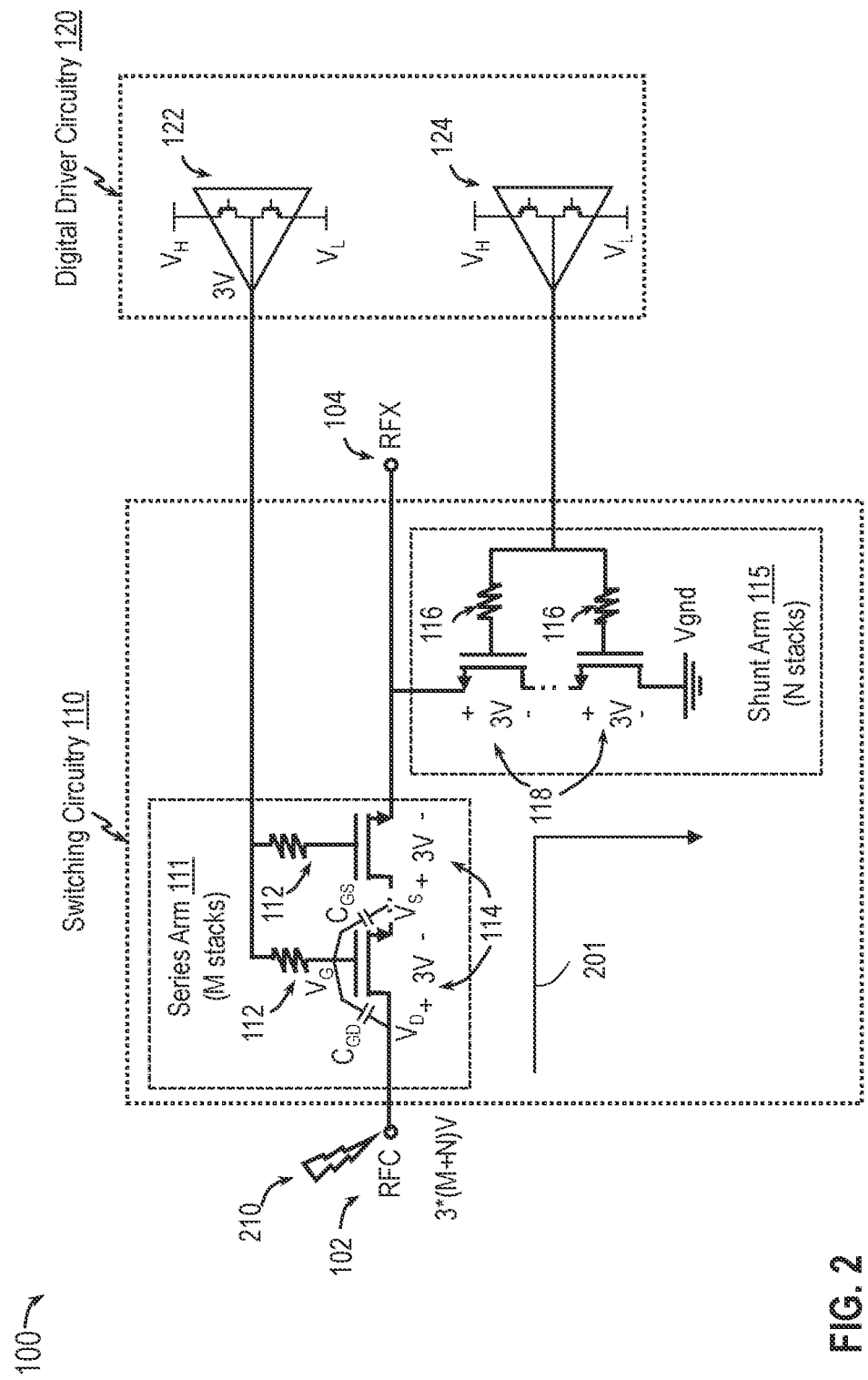
FIG. 2 is a schematic diagram illustrating an exemplary RF switch circuitry during an ESD event.

FIG. 2 is a schematic diagram illustrating the exemplary RF switch circuitry 100 during an ESD event. As shown, an ESD zap 210 may occur at the common port 102. When the ESD zap 210 (e.g., a voltage pulse that lasts a certain duration) hits between the common port 102 and ground (e.g., an ESD path 201), the transistors 114 and 118 in the path may start to conduct through their parasitic BJTs, causing each of the transistors 114 and 118 to have a certain drain-source voltages (Vds). In the illustrated example of FIG. 2, Vds for each transistor 114, 118 is shown as 3V, for example, based on the control voltage at the driver circuitry 122 and 124 being at about 3V. As such, the peak voltage at the common port 102 may be clamped at about 3×(M+N) V. As explained above, if the transistors 114 and 118 are large enough to thermally tolerate the power dissipated during the ESD zap 210 and the gate oxides of the transistors 114 and 118 are not exposed to voltage stresses that may cause the gate oxide to breakdown, the RF switch circuitry 100 can endure the ESD zap 210. For the gate oxides not to breakdown, the gate-source voltages (Vgs) and/or the gate-drain voltages (Vgd) of the transistors 114 and 118 have to be small enough. Additionally or alternatively, the gates of the transistors 114 and 118 have to be effectively floating during the ESD zap 210 such that the gate voltages may follow the source and drain voltages and therefore Vgs and Vgd may not increase significantly regardless of the clamp voltage.

As an example, for a low-power switch design (e.g., operating on signals with power of about 24 to 27 dBm), the series arm 111 may include 4 transistors 114 (i.e., M=4) and the shunt arm 115 may include 2 transistors (i.e., N=2). As such, there are a total of 6 transistors (the transistors 114 and 118) in the ESD path 201 between the common port 102 and ground, and thus the voltage at the common port 102 may be clamped at 18V. In certain aspects, the transistors 114 and 118 are designed such that the gate oxide can tolerate an 18V ESD voltage. Further, for a slow switching-speed design, the gate resistors 112 and 116 can be of a large resistance value (e.g., about 2 MΩ). As such, the gate discharge time constant may be large (e.g., about 1 us long with the capacitances $C_{GD}$ and $C_{GS}$ being about 0.5 picoFarad (pF) each) compared to a typical ESD zap duration which may be in the order of hundreds of ns (e.g., about 150 ns long). Accordingly, a low-power, slow-switching RF switch may be self-protecting in terms of ESD.

As another example, for a high-power switch design (e.g., operating on signals with power greater than about 30 dBm), the series arm 111 may include 6 transistors 114 (i.e., M=6) and the shunt arm 115 may include 4 transistors (i.e., N=4). As such, there are a total of 10 transistors (the transistors 114 and 118) in the ESD path between the common port 102 and ground, and thus the voltage at the common port 102 may be clamped at 30V, which may greater than a voltage that can be tolerated by the gate oxide. However, if the RF switch circuitry 100 is also for a slow switching-speed design, then the gate resistors 112 and 116 can be of a large resistance value (e.g., about 2 MO as similarly discussed above). As such, the gate discharge time constant (e.g., about 0.1 us with $C_{GD}$ and $C_{GS}$ being about 0.5 pF each) may be large compared to a typical ESD zap duration (e.g., about 150 ns long). For instance, when the voltage at the common port 102 is clamped at 30V, the gate voltage $V_G$ for the transistor 114 whose drain is directly connected to the common port 102 may be at about 28.5 V based on a voltage division. Because of the large gate discharge time constant, the gate voltage of the transistor 114 may initially follow the voltage rise in the drain and/or source voltages of the transistor and may not discharge quickly. Thus, the gate oxide may experience about 1.5V throughout the ESD zap 210 duration. As such, the gate oxide of the transistor 114 may not be stressed. The remaining transistors 114 and the transistors 118 may experience a similar condition. Accordingly, a high-power, slow-switching RF switch may also be self-protecting in terms of ESD.

The ESD problem may arise when the RF switch circuitry 100 is designed for high-power and fast-switching design. For instance, the series arm 111 may include 6 transistors 114 (i.e., M=6) and the shunt arm 115 may include 4 transistors (i.e., N=4) as discussed above. However, to support a fast switching-speed design, the gate resistors 112 and 116 have to be of a small resistance value, for example, about 10 kΩ instead of 2 MΩ. As such, the gate discharge time constant is small (e.g., about 5 ns with $C_{GD}$ and $C_{GS}$ being about 0.5 pF each). In this case, the gate discharge time constant is substantially shorter than the ESD zap 210 duration (e.g., about 150 ns). As such, the gate voltage of the transistors 114 and 118 may discharge quickly, causing the gate voltage to drop to a voltage determined by the output voltage of the driver circuitry 122 or 124 (e.g., as shown in the graph 300 of FIG. 3).

Figure 3:
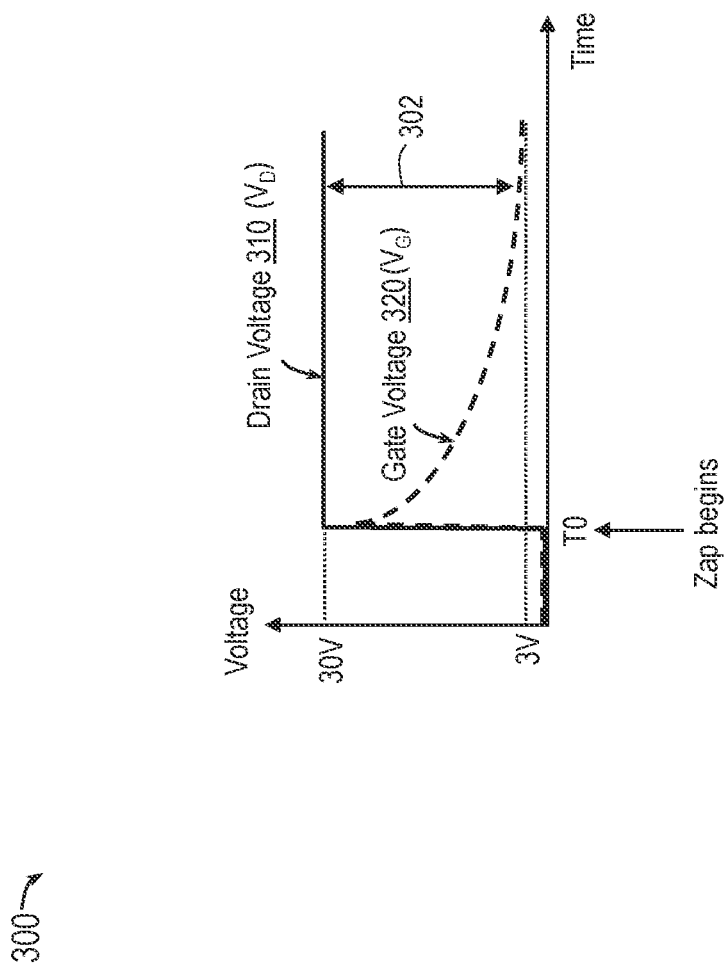
FIG. 3 is a graph illustrating gate and drain voltages at high-power, fast-switching RF switch circuitry during an ESD event.

FIG. 3 is a graph 300 illustrating gate and drain voltages at a high-power, fast-switching RF switch circuitry during an ESD event. For instance, the high-power, fast-switching RF switch circuitry may correspond to the RF switch circuitry 100 with M being 6 and N being 4 as discussed above. In FIG. 3, the x-axis represents time in some arbitrary units, and the y-axis represents voltage in some arbitrary units. As shown, at time T0, an ESD zap (e.g., the ESD zap 210) may begin, and the drain voltage $V_D$ 310 of the transistor 114 whose drain is directly connected to the common port 102 may be at about 30V. The gate voltage $V_G$ 320 may initially (or instantaneously) follow the voltage rise in the drain voltage $V_D$ 310. However, because of the small gate discharge time constant, the gate voltage $V_G$ 320 may quickly discharge to a voltage determined by the driver circuitry 122, for example, at about 3V, which is much smaller compared to the drain voltage $V_D$ 310. Thus, a large portion 302 of the 30V clamp voltage may appear at the gate oxide. In other words, the gate-drain voltage $V_{GD}$ may be high (e.g., at about 27V), causing the gate oxide to breakdown.

Accordingly, a high-power, fast-switching RF switch may not provide self-protection for ESD.

Example ESD-Protected High-Power, Fast-Switching RF Switch Circuitry

Figure 4:
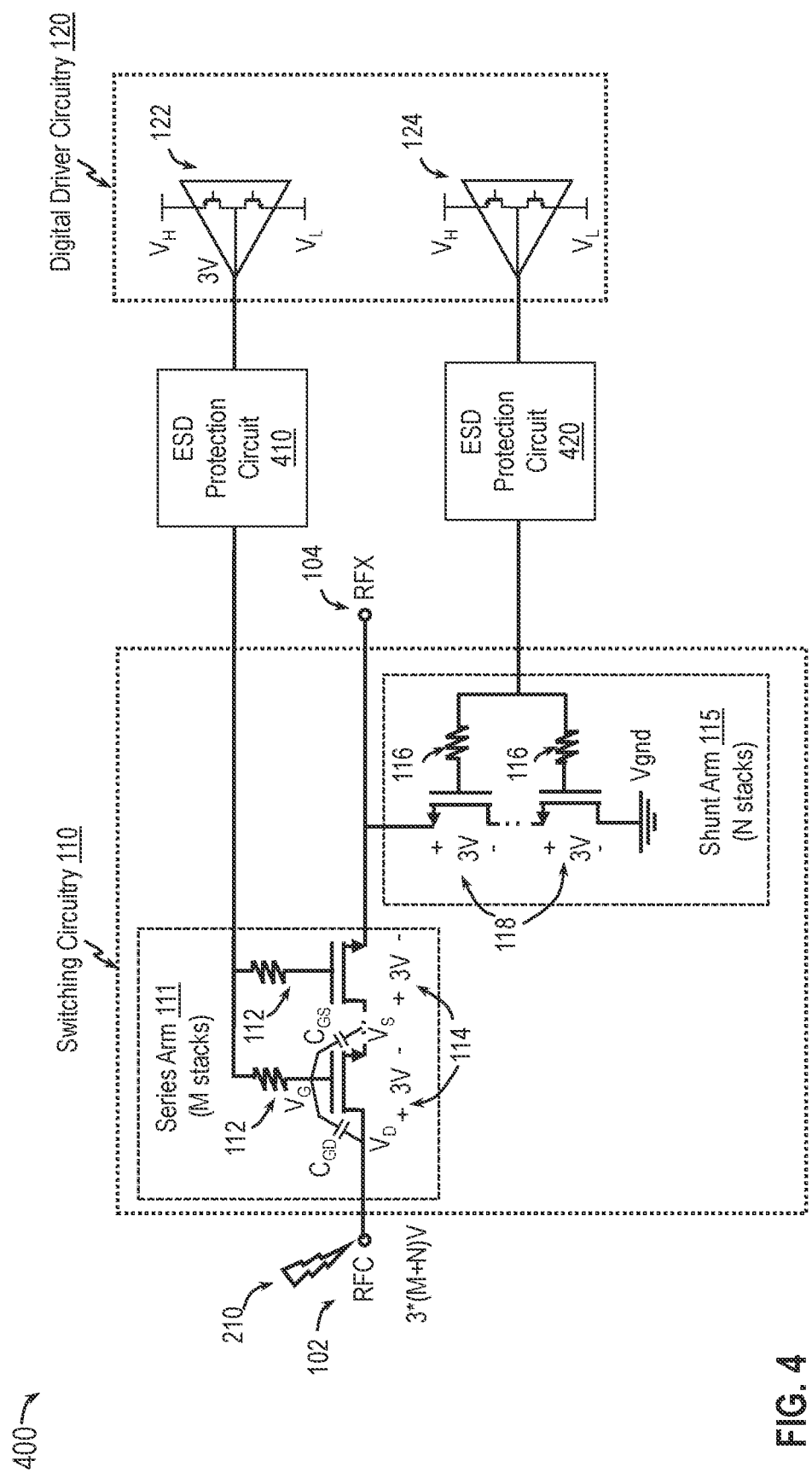
FIG. 4 is a schematic diagram illustrating an exemplary ESD-protected, high-power, fast-switching RF switch circuitry, according to embodiments of the present disclosure.

FIG. 4 is a schematic diagram illustrating an exemplary ESD-protected, high-power, fast-switching RF switch circuitry 400, according to embodiments of the present disclosure. The RF switch circuitry 400 of FIG. 4 shares many elements with the RF switch circuitry 100 of FIG. 1 and the same reference numerals as in FIG. 1 are used in FIG. 4 to refer to the same or analogous elements of FIG. 1; for brevity, a discussion of these elements is not repeated, and these elements may take the form of any of the embodiments disclosed herein.

For instance, the RF switch circuitry 400 may include the switch circuitry 110 coupled between the common port 102 and the terminal port 104. The switch circuitry 110 may include a plurality of stacked transistors 114 in the series arm 111 and a plurality of stacked transistors 118 in the shunt arm 115. The gates of the transistors 114 may be coupled to the driver circuitry 122, and the gates of the transistors 118 may be coupled to the driver circuitry 124. In certain examples, the series arm 111 may include 6 stacked transistors 114 and the shunt arm 115 may include 4 stacked transistors 118 as discussed above. To support fast switching, the resistors 112 and 116 may be small (e.g., in the order of tens of kΩ, for example, 10 kΩ).

To provide ESD protection, the RF switch circuitry 400 may further include ESD circuitries 410 and 420. The ESD protection circuitry 410 may be coupled between the gates of the transistors 114 (in the series arm 111) and the driver circuitry 122. In a similar way, the ESD protection circuitry 420 may be coupled between the gates of the transistors 118 (in the shunt arm 115) and the driver circuitry 124. During normal operation, the ESD protection circuitry 410 may pass or electrically couple a control voltage from the driver circuitry 122 to the gates of the transistors 114 in the series arm 111 (to control the switching of the transistors 114 as discussed above). However, during an ESD zap 210, the ESD protection circuitry 410 may electrically decouple (or "float") the gates of the transistors 114 from the driver circuitry 122 and thereby allowing the gate voltages to follow the source and/or drain voltages of the respective transistors 114 so that the gate oxide of the transistors 114 may not breakdown. Stated differently, ESD protection circuitry 410 may act as a closed circuitry during normal operation and as an open circuit during an ESD event. In a similar way, during normal operation, the ESD protection circuitry 420 may pass or electrically couple a control voltage from the driver circuitry 124 to the gates of the transistors 118 in the shunt arm 115 (to control the switching on/off of the transistors 118 as discussed above). However, during an ESD zap 210, the ESD protection circuitry 420 may electrically decouple (or "float") the gates of the transistors 118 from the driver circuitry 124 and thereby allowing the gate voltages to follow the source and/or drain voltages of the respective transistors 118 so that the gate oxide of the transistor 118 may not breakdown.

Figure 5:
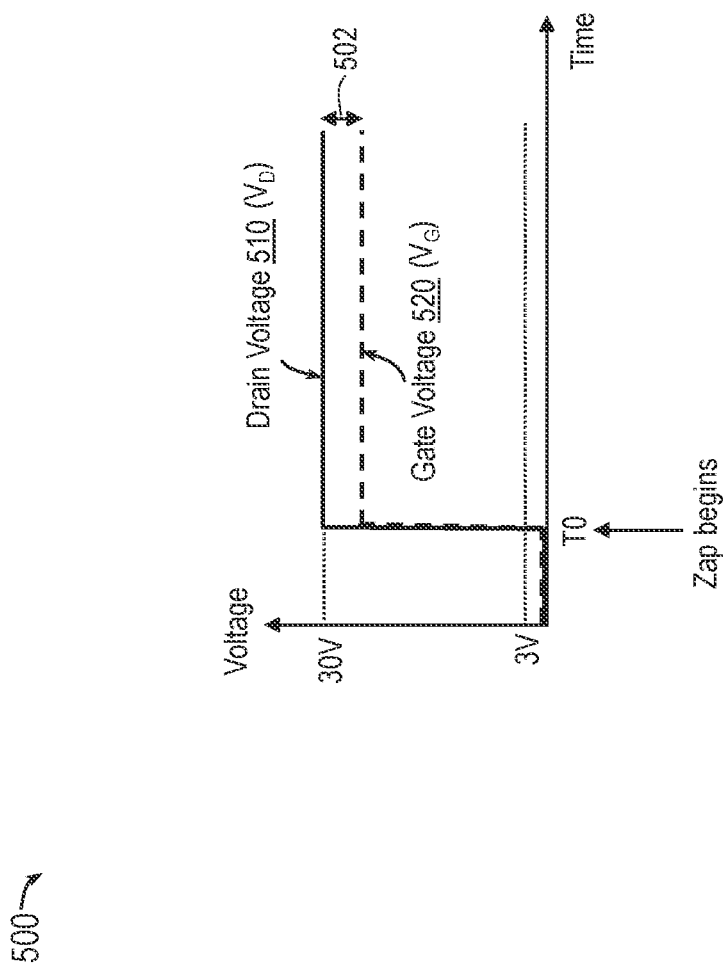
FIG. 5 is a graph illustrating gate and drain voltages at ESD-protected, high-power, fast-switching RF switch circuitry during an ESD event, according to embodiments of the present disclosure.

FIG. 5 is a graph 500 illustrating gate and drain voltages at the ESD-protected, high-power, fast-switching RF switch circuitry 400 during an ESD event (e.g., the ESD zap 210), according to embodiments of the present disclosure. In FIG. 5, the x-axis represents time in some arbitrary units, and the y-axis represents voltage in some arbitrary units. The graph 500 may be illustrated for the example discussed above where M is 6 (e.g., the number of stacked transistors 114 in the series arm 111), N is 4 (e.g., the number of stacked transistors 118 in the shunt arm 115), and the drain-source voltages of the transistors 114 and 118 are about 3V each during the ESD zap 210. As such, the clamped voltage at the common port 102 may be about 30V.

As shown in FIG. 5, at time T0, an ESD zap (e.g., the ESD zap 210) may begin, and the drain voltage $V_D$ 510 of the transistor 114 whose drain is directly connected to the common port 102 may be at about 30V. Because the ESD protection circuitry 410 floats or decouples the gates of the transistors 114 from the driver circuitry 122 during the ESD zap, the gate voltage $V_G$ 520 may follow the voltage rise in the drain voltage $V_D$ 510 as shown. For instance, the gate voltage $V_G$ 520 may be at about 28.5V based on a voltage division. Thus, there may be a small voltage 502 appear (e.g., about 1.5V corresponding to $V_G$ D) at the gate oxide of the transistors 114. As such, the gate oxide may not breakdown. Stated differently, the ESD protection circuitry 410 may provide ESD protection to the transistors 114 in the series arm 111 by floating the gates of the transistors 114 during an ESD event.

While FIG. 5 illustrates the drain and gate voltages of the transistor 114 whose drain is directly connected to the common port 102 during an ESD event, the gate and drain voltages for the remaining transistor 114 may have similar trend as shown in FIG. 5 during the ESD event. Further, the ESD protection circuitry 420 may also operate in the same way as the ESD protection circuitry 410 to provide ESD protection to the transistors 118.

Figure 6:
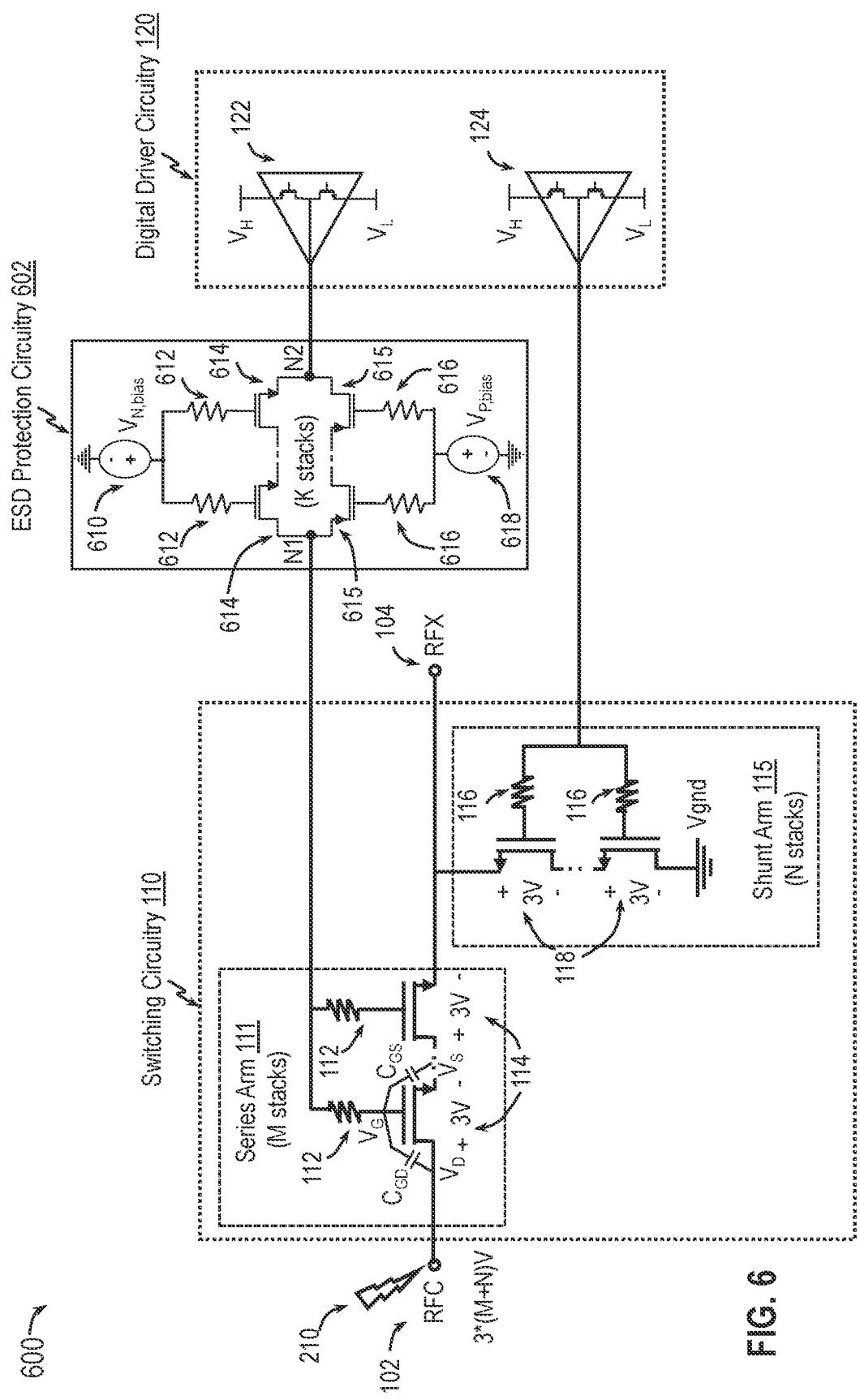
FIG. 6 is a schematic diagram illustrating an exemplary ESD-protected, high-power, fast-switching RF switch circuitry, according to embodiments of the present disclosure.

FIG. 6 is a schematic diagram illustrating an exemplary ESD-protected, high-power, fast-switching RF switch circuitry 600, according to embodiments of the present disclosure. The RF switch circuitry 600 of FIG. 6 shares many elements with the RF switch circuitry 100 of FIG. 1 and the same reference numerals as in FIG. 1 are used in FIG. 6 to refer to the same or analogous elements of FIG. 1; for brevity, a discussion of these elements is not repeated, and these elements may take the form of any of the embodiments disclosed herein. Further, the RF switch circuitry 600 may use similar ESD protection mechanisms as the RF switch circuitry 400 discussed above with reference to FIG. 4 and provide an example implementation for the ESD protection circuitry 410. For simplicity of illustration, FIG. 6 illustrates an ESD protection circuitry 602 coupled between the gates of the transistors 114 in the series arm 111 and the respective driver circuitry 122 only. However, a similar ESD protection circuitry may also be used between the gates of the transistors in the shunt arm 115 and the respective driver circuitry 124.

As shown in FIG. 6, the ESD protection circuitry 602 may include K stacks of complementary transistors 614 and 615, where the transistors 614 are NMOS devices and the transistors 615 devices are PMOS devices. More specifically, the source terminal of one transistor 614 may be coupled to the drain terminal of an adjacent transistor 614. Similarly, the source terminal of one transistor 615 may be coupled to the drain terminal of an adjacent transistor 615. Further, the drain of the transistor 614 that is connected to the gates of the transistors 114 is further connected to the source of the transistor 615 that is connected to the gates of the transistors 114 (e.g., at node N1). Further still, the source of the transistor 614 that is connected to the driver circuitry 122 is further connected to the drain of the transistor 615 that is connected to the driver circuitry 122 (e.g., at node N2).

As further shown in FIG. 6, the gates of the transistors 614 (NMOS devices) are biased by a voltage source 610 (e.g., shown as $V_{N,bias}$) via respective resistors 612. The gates of the transistors 615 (PMOS devices) are biased by a voltage source 618 (e.g., shown as $V_{P,bias}$) via respective resistors 616. The voltage source 610 is set to a voltage level such that the transistors 614 are on. Similarly, the voltage source 618 is set to a voltage level such that the transistors 615 are on. In some examples, the voltage sources 610 and 618 may be set to 0V.

As an example, the driver circuitry 122 may operate between 3.3V (e.g., voltage rail $V_H$) and −2.5V (e.g., voltage rail $V_L$). For instance, during normal operation, the driver circuitry 122 may provide a control voltage of 3.3V during one state and −2.5 voltage during another state. When the driver circuitry 122 outputs a 3.3V voltage, the transistors 614 (NMOS devices) are off and the transistors 615 (PMOS devices) pass the 3.3V to the gates of the transistors 114. On the other hand, when the driver circuitry 122 outputs a −2.5V voltage, the transistors 615 (PMOS devices) are off and the transistors 614 (NMOS devices) pass the −2.5V to the gates of the transistors 114. In some instances, the transistors 614 and 615 may be referred to as pass gate transistors.

During an ESD event (e.g., the ESD zap 210), the clamp voltage at the common port 102 may be determined by the number of stacks (e.g., M+N) in the ESD path. The number of stacks K in the ESD protection circuitry 602 may be selected to be greater than (M+N) such that the gate voltage $V_G$ is not high enough to turn on the BJTs of the pass gate transistors 614 and 615. For instance, K can be 12 when M is 6 and N is 4. As such, the pass gate transistors 614 and 615 are off and the gates of the transistors 114 may be floating (e.g., electrically decoupled from the driver circuitry 122) and only connected to each other via the gate resistors 112 (e.g., 10 kΩ). Thus, there can be charge sharing among the transistors 112. Further, the gate resistors 612 and 616 may be selected to have a high resistance value so that the gate discharge time constant for the transistors 614 and 615 may be longer than the ESD zap 210 duration. For example, the gate discharge time constant for each of the transistors 614 and 615 may be about 1000 nanoseconds, and the ESD zap 210 may have a duration of about 100 nanoseconds. In this way, the gates of the pass gate transistors 614 and 615 may also be floating, and thus may not experience any gate oxide stress during the ESD event. In some aspects, the size of the pass gate transistors 614 and 615 may be small since the ESD current through the pass gate transistors 614 and 615 may be limited by the resistors 112. For instance, the pass gate transistors 614 and 615 can have smaller sizes than the transistors 114 in the series arm 111 and/or transistors 118 in the shunt arm 115.

Figure 7:
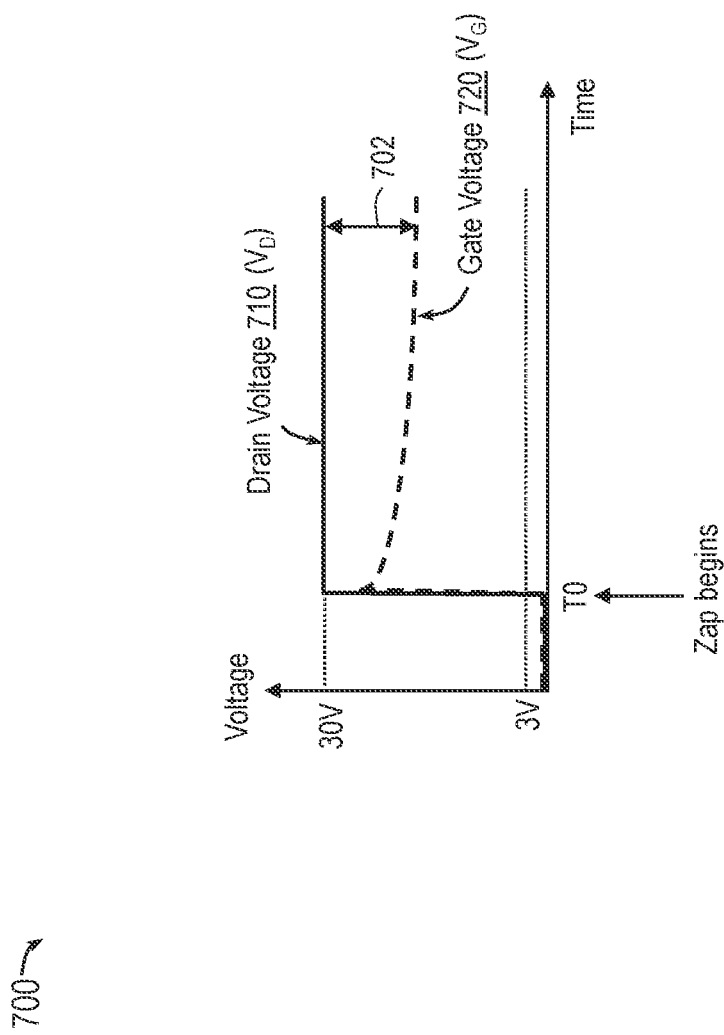
FIG. 7 is a graph illustrating gate and drain voltages at an ESD-protected, high-power, fast-switching RF switch circuitry during an ESD event, according to embodiments of the present disclosure.

FIG. 7 is a graph 700 illustrating gate and drain voltages at the ESD-protected, high-power, fast-switching RF switch circuitry 600 during an ESD event (e.g., the ESD zap 210), according to embodiments of the present disclosure. In FIG. 7, the x-axis represents time in some arbitrary units, and the y-axis represents voltage in some arbitrary units. The graph 700 may be illustrated for the example discussed above where M is 6 (e.g., the number of stacked transistors 114 in the series arm 111), N is 4 (e.g., the number of stacked transistors 118 in the shunt arm 115), K is 12 (e.g., the number of stacks of pass gate transistors 614 and 615 in the ESD protection circuitry 602), and the drain-source voltages of the transistors 114 and 118 are about 3V each during the ESD zap 210. As such, the clamped voltage at the common port 102 may be about 30V.

As shown in FIG. 7, at time T0, an ESD zap (e.g., the ESD zap 210) may begin, and the drain voltage $V_D$ 710 of the transistor 114 whose drain is directly connected to the common port 102 may be at about 30V. Because the ESD protection circuitry 410 floats or decouples the gates of the transistors 114 from the driver circuitry 122 during the ESD zap, the gate voltage $V_G$ 720 may follow the voltage rise in the drain voltage $V_D$ 710 (and source voltage as well) as shown. However, while the gates of the transistors 114 are decoupled from the driver circuitry 122 during the ESD event, there is charge sharing among the transistors 114 as discussed above. As such, the gate voltage $V_G$ 720 may not be at 28.5V, but slightly lower than 28.5V. However, the voltage 702 (e.g., corresponding to $V_G$ D) that may appear at the gate oxide of the transistors 114 may still be significantly small compared to the drain voltage $V_D$ 710. As such, the gate oxide stress may significantly be relieved.

While FIG. 7 illustrates the drain and gate voltages of the transistor 114 whose drain is directly connected to the common port 102 during an ESD event, the gate and drain voltages for the remaining transistor 114 may have similar trend as shown in FIG. 7 during the ESD event.

Figure 8:
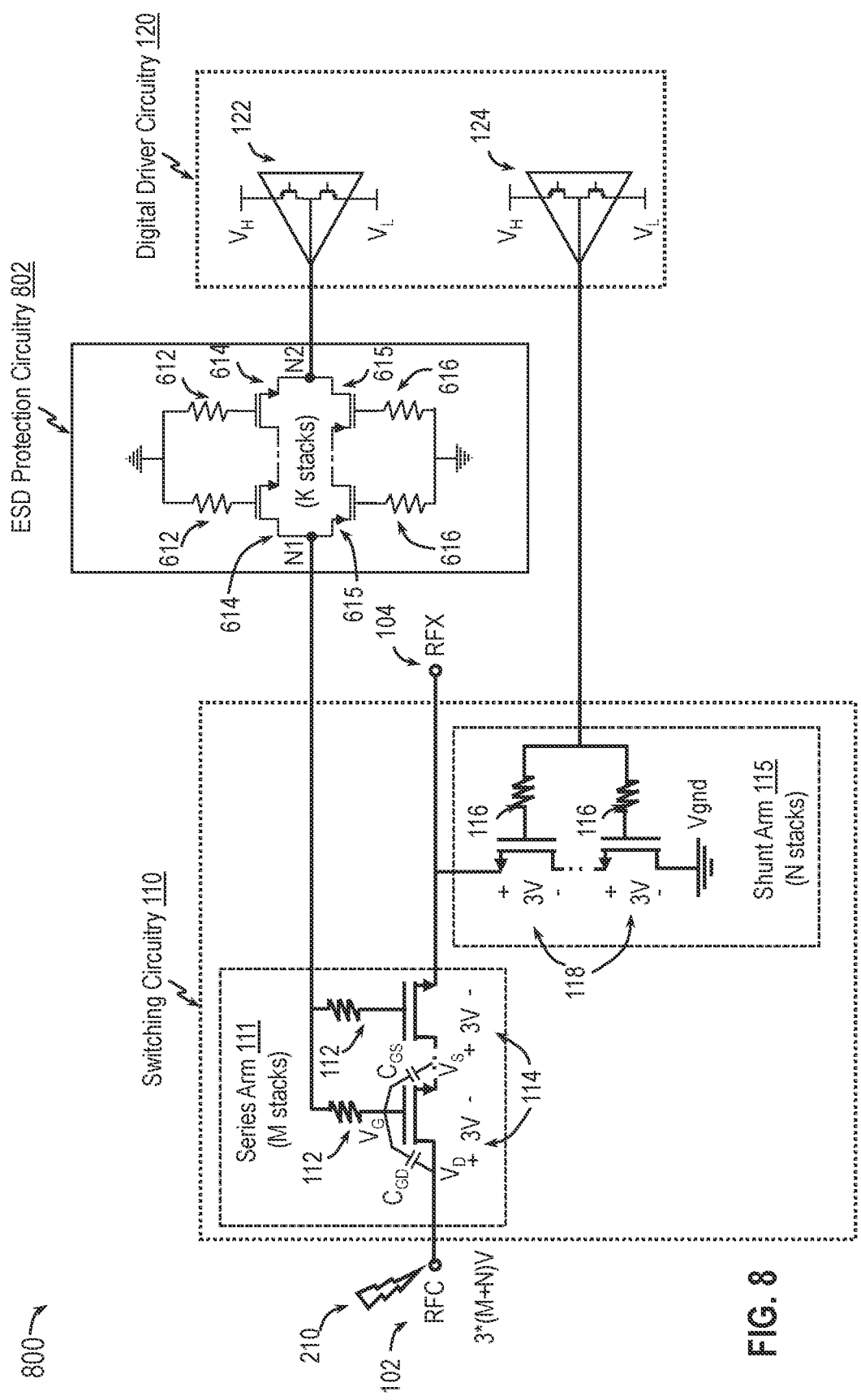
FIG. 8 is a schematic diagram illustrating an exemplary ESD-protected, high-power, fast-switching RF switch circuitry, according to embodiments of the present disclosure.

FIG. 8 is a schematic diagram illustrating an exemplary ESD-protected, high-power, fast-switching RF switch circuitry 800, according to embodiments of the present disclosure. The RF switch circuitry 800 of FIG. 8 shares many elements with the RF switch circuitry 600 of FIG. 6 and the same reference numerals as in FIG. 6 are used in FIG. 8 to refer to the same or analogous elements of FIG. 6; for brevity, a discussion of these elements is not repeated, and these elements may take the form of any of the embodiments disclosed herein.

As shown in FIG. 8, the RF switch circuitry 800 may include an ESD protection circuitry 802 coupled between the gates of the transistors 114 in the series arm 111 of the switch circuitry 110 and the driver circuitry 122. The ESD protection circuitry 802 may be substantially similar to the ESD protection circuitry 602. However, the gates of the pass gate transistors 614 and 615 may be connected directly to ground instead of to voltage bias sources as in FIG. 6. There are various design factors that may determine whether the pass gate transistors 614 and 615 can be directly ground. Some example design factors may include, but not limited to, the driver voltage levels of the driver circuitry 122, the voltage rating of the transistors 614 and 615. Directly grounding the pass gate transistors 614 and 615 can advantageously eliminate the need for additional bias voltage sources at the gates of the transistors 614 and 615, and thus may save chip area and/or cost.

Further, while not shown in FIG. 8, the RF switch circuitry 800 may further include an ESD protection similar to the ESD protection circuitry 802 coupled between the gates of the transistors 118 in the shunt arm 115 of the switch circuitry 110 and the driver circuitry 124 to provide ESD protection to the transistors 118.

Figure 9:
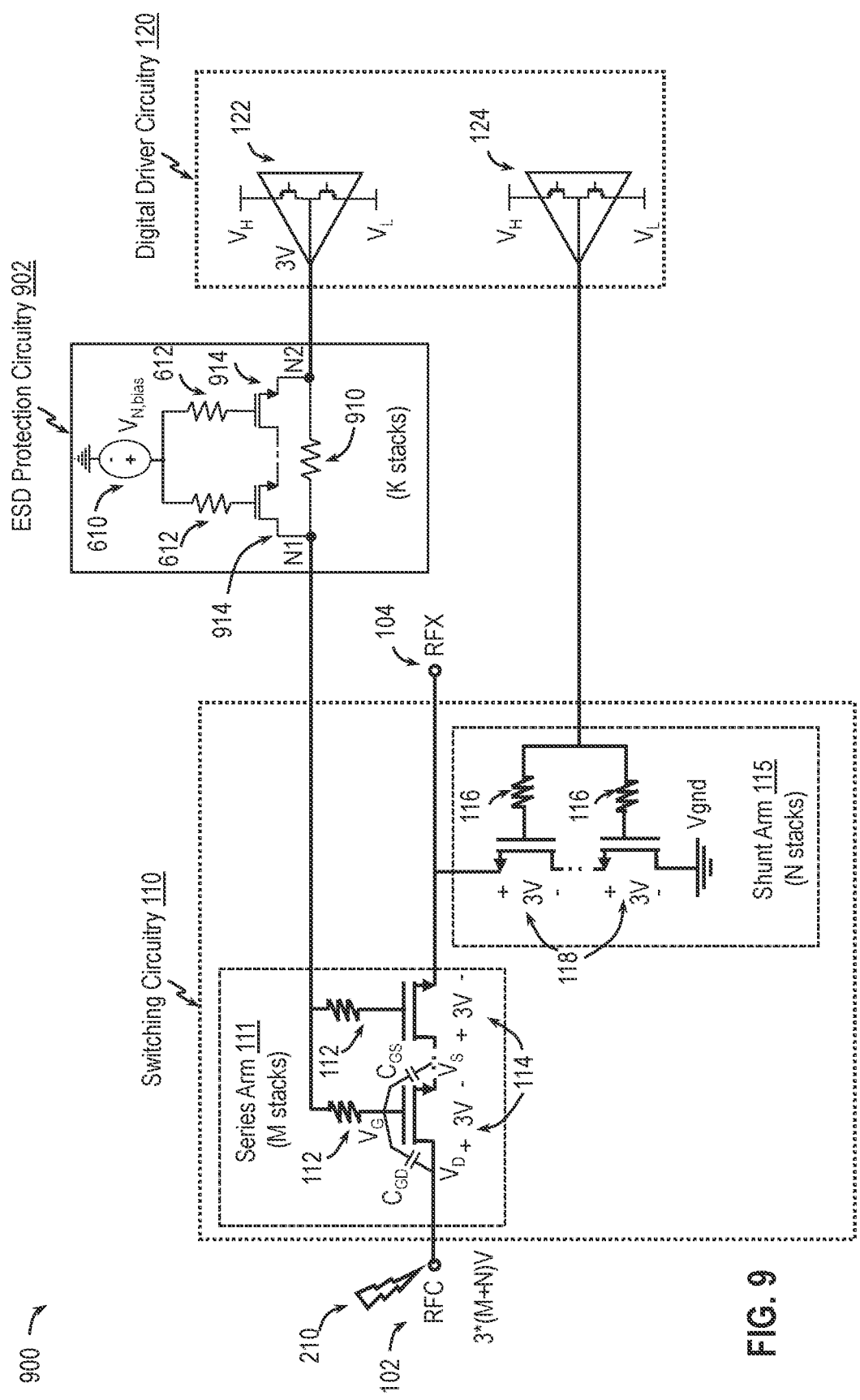
FIG. 9 is a schematic diagram illustrating an exemplary ESD-protected, high-power, fast-switching RF switch circuitry, according to embodiments of the present disclosure.

FIG. 9 is a schematic diagram illustrating an exemplary ESD-protected, high-power, fast-switching RF switch circuitry 900, according to embodiments of the present disclosure. The RF switch circuitry 900 of FIG. 9 shares many elements with the RF switch circuitry 600 of FIG. 6 and the same reference numerals as in FIG. 6 are used in FIG. 9 to refer to the same or analogous elements of FIG. 6; for brevity, a discussion of these elements is not repeated, and these elements may take the form of any of the embodiments disclosed herein.

As shown in FIG. 9, the RF switch circuitry 900 may include an ESD protection circuitry 902 coupled between the gates of the transistors 114 in the series arm 111 of the switch circuitry 110 and the driver circuitry 122. The ESD protection circuitry 902 may be substantially similar to the ESD protection circuitry 602. However, the ESD protection circuitry 902 may include NMOS only pass gate transistors 914 connected in a stacked configuration (e.g., K stacks, where K may be greater than (M+N) as discussed above). The pass gate transistors 914 may be substantially similar to the transistors 614. The gate of each of the pass gate transistors 914 may be coupled to the bias voltage source 610 via a respective resistor 612 (e.g., of about 2 MΩ) as discussed above with reference to FIG. 6. Alternatively, the gate of each of the pass gate transistors 914 may be connected directly to ground via a respective resistor 612 as shown in FIG. 8.

There are various design factors that may determine whether the NMOS only pass gate transistors 914 can be used to float the gates of the transistors 114 during an ESD event. Some example design factors may include, but not limited to, the driver voltage levels of the driver circuitry 122, the voltage rating of the transistors 914. Using NMOS only pass gate transistors 914 can advantageously reduce the number of components, and thus may save chip area and/or cost.

Further, the RF switch circuitry 900 may optionally include a resistor 910 connected in parallel with the pass gate transistors 914. More specially, the drain of the transistor 914 that is connected to the gates of the transistors 114

(in the series arm 111) is further connected to one terminal of the parallel-connected resistor 910 (e.g., at node N1), and the source of the transistor 914 that is connected to the driver circuitry 122 is further connected to the other terminal of the parallel-connected resistor 910 (e.g., at node N2). When the resistor 910 is arranged in parallel with pass gate transistors 914, there is voltage division between the gate resistors 112 and the resistor 910 during the ESD event. For instance, the ESD voltage on the pass gates may be reduced compared to the arrangement without the parallel resistor 910. Therefore, adding the parallel resistor 910 can advantageously allow for a reduced number of pass gate transistors 914 (e.g., a smaller K) in the ESD protection circuitry 902, and thus may save area and reduce the resistance contribution from pass gate transistors 914 during normal operation. However, the ESD voltage appear on gate oxide may be increased compared to the arrangement without the parallel resistor 910. In general, an optimum resistance value may be selected for the parallel resistor 910 such that the number of pass gate stacks (e.g., K) can be reduced while achieving the desired ESD rating.

Further, while not shown in FIG. 9, the RF switch circuitry 900 may further include an ESD protection similar to the ESD protection circuitry 902 coupled between the gates of the transistors 118 in the shunt arm 115 of the switch circuitry 110 and the driver circuitry 124 to provide ESD protection to the transistors 118.

Figure 10:
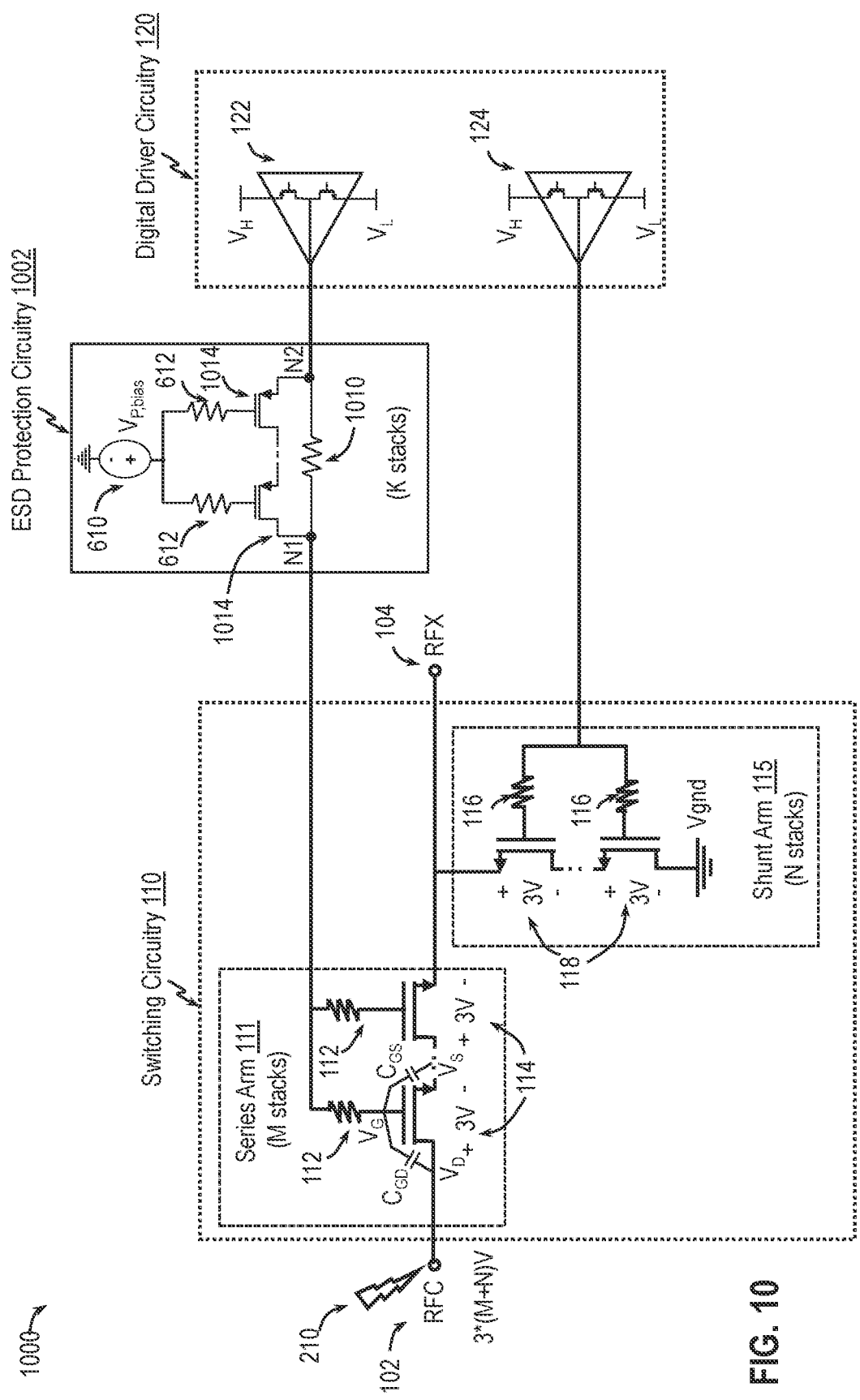
FIG. 10 is a schematic diagram illustrating an exemplary ESD-protected, high-power, fast-switching RF switch circuitry, according to embodiments of the present disclosure.

FIG. 10 is a schematic diagram illustrating an exemplary ESD-protected, high-power, fast-switching RF switch circuitry 1000, according to embodiments of the present disclosure. The RF switch circuitry 1000 of FIG. 10 shares many elements with the RF switch circuitry 600 of FIG. 6 and the same reference numerals as in FIG. 6 are used in FIG. 10 to refer to the same or analogous elements of FIG. 6; for brevity, a discussion of these elements is not repeated, and these elements may take the form of any of the embodiments disclosed herein.

As shown in FIG. 10, the RF switch circuitry 1000 may include an ESD protection circuitry 1002 coupled between the gates of the transistors 114 in the series arm 111 of the switch circuitry 110 and the driver circuitry 122. The ESD protection circuitry 1002 may be substantially similar to the ESD protection circuitry 602. However, the ESD protection circuitry 1002 may include PMOS only pass gate transistors 1014 connected in a stacked configuration (e.g., K stacks, where K may be greater than (M+N) as discussed above). The pass gate transistors 1014 may be substantially similar to the transistors 615. The gate of each of the pass gate transistors 1014 may be coupled to the bias voltage source 618 via a respective resistor 616 (e.g., of about 2 MΩ) as discussed above with reference to FIG. 6. Alternatively, the gate of each of the pass gate transistors 1014 may be connected directly to ground via a respective resistor 616 as shown in FIG. 8.

There are various design factors that may determine whether the PMOS only pass gate transistors 1014 can be used to float the gates of the transistors 114 during an ESD event. Some example design factors may include, but not limited to, the driver voltage levels of the driver circuitry 122, the voltage rating of the transistors 1014. Using PMOS only pass gate transistors 1014 can advantageously reduce the number of components, and thus may save chip area and/or cost.

Further, the RF switch circuitry 1000 may optionally include a resistor 1010 connected in parallel with the pass gate transistors 1014. More specially, the drain of the transistor 1014 that is connected to the gates of the transistors 114 (in the series arm 111) is further connected to one terminal of the parallel-connected resistor 1010 (e.g., at node N1), and the source of the transistor 1014 that is connected to the driver circuitry 122 is further connected to the other terminal of the parallel-connected resistor 1010 (e.g., at node N2). As similarly discussed above with reference to FIG. 9, adding the parallel resistor 1010 can advantageously allow for a reduced number of pass gate transistors 1014 (e.g., a smaller K) in the ESD protection circuitry 1002, and thus may save area and reduce the resistance contribution from pass gate transistors 1014 during normal operation. However, the ESD voltage appear on gate oxide may be increased compared to the arrangement without the parallel resistor 1010. In general, an optimum resistance value may be selected for the parallel resistor 1010 such that the number of pass gate stacks (e.g., K) can be reduced while achieving the desired ESD rating.

Further, while not shown in FIG. 10, the RF switch circuitry 800 may further include an ESD protection similar to the ESD protection circuitry 1002 coupled between the gates of the transistors 118 in the shunt arm 115 of the switch circuitry 110 and the driver circuitry 124 to provide ESD protection to the transistors 118.

In some aspects, the ESD protection circuitry 602 of FIG. 6 may also include a resistor connected across nodes N1 and N2 (of the circuitry 602) in parallel to the pass gate transistors 614 and 615 similar to the arrangement shown in FIGS. 9 and 10. Similarly, the ESD protection circuitry 802 of FIG. 8 may also include a resistor connected across nodes N1 and N2 (of the circuitry 802) in parallel to the pass gate transistors 614 and 615 similar to the arrangement shown in FIGS. 9 and 10.

While the value K for the number of pass gate transistor stacks in the ESD protection circuitries 602, 802, 902, and/or 1002 are selected to be greater than a respective total M+N number of transistor stacks in the ESD path in FIGS. 6, 8, 9, and 10, K can be selected to be smaller than (M+N), for example, depending on the voltage ratings of the pass gate transistors. As an example, if each of the pass gate transistors 614 and 615 in the ESD protection circuitries 602 and/or 802 can handle a high voltage, K can be smaller than the (M+N) value in the RF switch circuitries 600 and/or 800, respectively. Similarly, if each of the pass gate transistors 914 in the ESD protection circuitries 902 can handle a high voltage, K can be smaller than the (M+N) value in the RF switch circuitry 900. If each of the pass gate transistors 1014 in the ESD protection circuitry 1002 can handle a high voltage, K can be smaller than the (M+N) value in the RF switch circuitry 1000.

Figure 11:
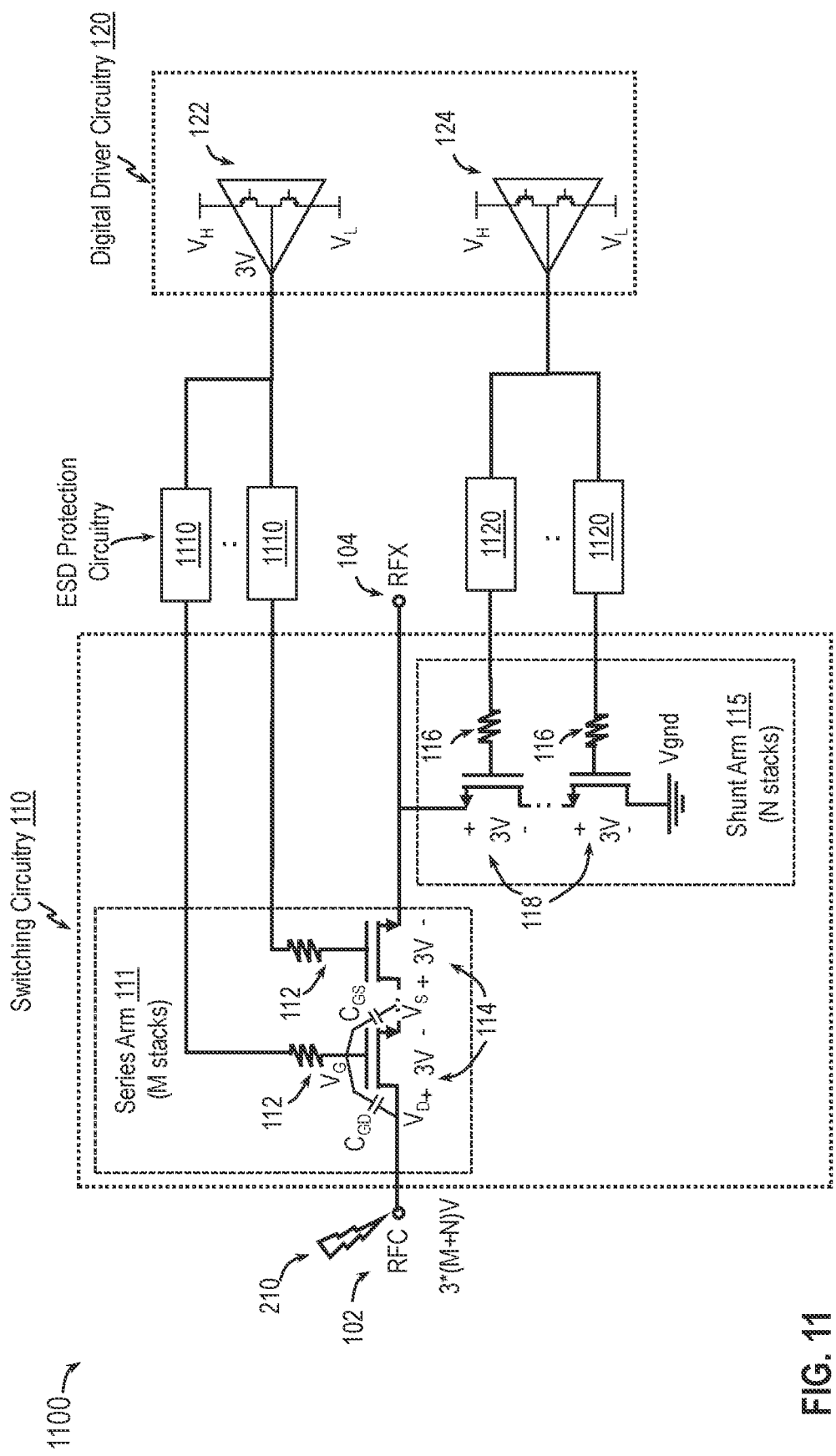
FIG. 11 is a schematic diagram illustrating an exemplary ESD-protected, high-power, fast-switching RF switch circuitry, according to embodiments of the present disclosure.

FIG. 11 is a schematic diagram illustrating an exemplary ESD-protected, high-power, fast-switching RF switch circuitry 1100, according to embodiments of the present disclosure. The RF switch circuitry 1100 of FIG. 11 shares many elements with the RF switch circuitry 400 of FIG. 4 and the same reference numerals as in FIG. 4 are used in FIG. 11 to refer to the same or analogous elements of FIG. 4; for brevity, a discussion of these elements is not repeated, and these elements may take the form of any of the embodiments disclosed herein.

As shown in FIG. 11, the RF switch circuitry 1100 may utilize an individual ESD protection circuitry 1110 to protect each of the stacked transistors 114 in the series arm 111 and utilize an individual ESD protection circuitry 1120 to protect each of the stacked transistors 118 in the shunt arm 115 of the switch circuitry 110 instead of one common ESD protection circuitry 410 for all stacked transistors 114 in the series arm 111 and one common ESD protection circuitry 420 for all stacked transistors 118 in the shunt arm 115 as shown in FIG. 4. More specifically, for each stacked transistor 114, an individual ESD protection circuitry 1110 is coupled between the gate of the respective stacked transistor 114 and the driver circuitry 122. Similarly, for each stacked transistor 118, an individual ESD protection circuitry 1120 is coupled between the gate of the respective stacked transistor 118 and the driver circuitry 124.

Each of the ESD protection circuitries 1110 or 1120 may pass a control voltage from a respective driver circuitry 122 or 124 to the gate of a respective transistor 114 or 118 during normal operation and may electrically decouple or float the gate of the respective transistor 114 or 118 from the respective driver circuitry 122 or 124 during an ESD event (e.g., the ESD zap 210) as discussed herein. The ESD protection circuitries 1110 and 1120 may be implemented in any suitable ways, for example, using any suitable combination of the ESD protection circuitries 602, 802, 902, and/or 1002 discussed above with reference to FIG. 6, 8, 9, or 10, respectively. While FIG. 11 illustrates that each of the transistors 114 in the series arm 111 is ESD-protected using an ESD protection circuitry 1110, in some instances, different transistors 114 (in the series arm 111) can be ESD-protected using different arrangements of ESD protection circuitries. Similarly, different transistors 118 (in the shunt arm 115) can be ESD-protected using different arrangements of ESD protection circuitries. Utilizing separate individual ESD protection circuitry for each transistor 114, 118 in the switch circuitry 110 can advantageously prevent the gate from discharging as shown in the graph 700 of FIG. 7.

Figure 12:
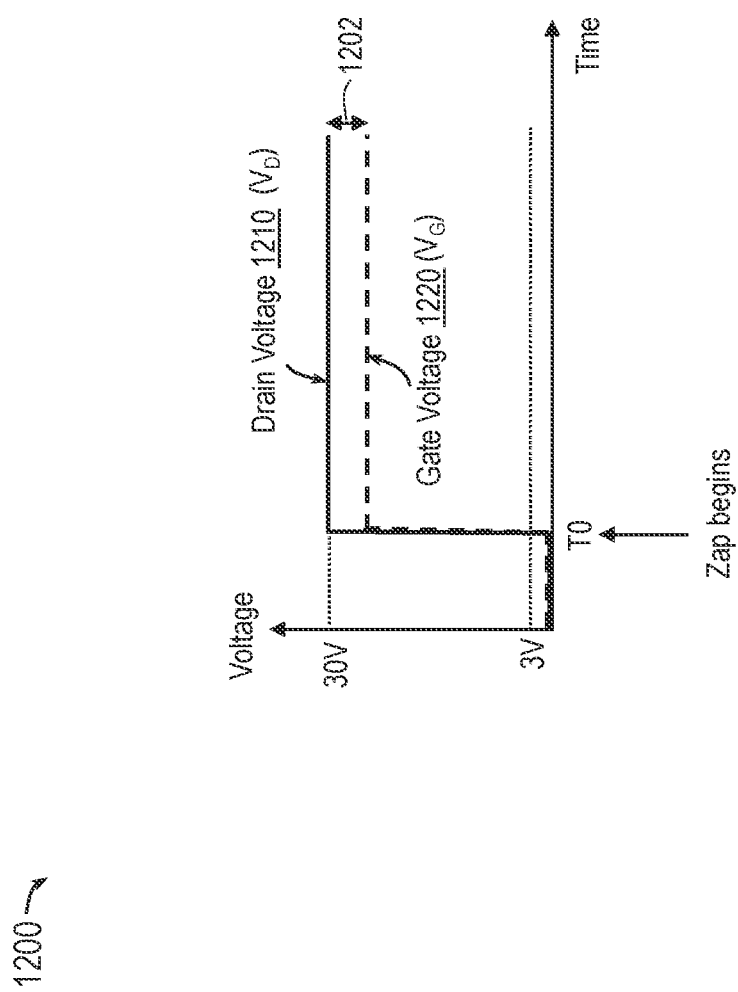
FIG. 12 is a graph illustrating gate and drain voltages at an ESD-protected, high-power, fast-switching RF switch circuitry during an ESD event, according to embodiments of the present disclosure.

FIG. 12 is a graph 1200 illustrating gate and drain voltages at the ESD-protected, high-power, fast-switching RF switch circuitry 1100 during an ESD event (e.g., the ESD zap 210), according to embodiments of the present disclosure. In FIG. 12, the x-axis represents time in some arbitrary units, and the y-axis represents voltage in some arbitrary units. The graph 1200 may be illustrated for the example discussed above where M is 6 (e.g., the number of stacked transistors 114 in the series arm 111), N is 4 (e.g., the number of stacked transistors 118 in the shunt arm 115), K is 12 (e.g., the number of stacks of pass gate transistors in the ESD protection circuitries 1110 and/or 1120), and the drain-source voltages of the transistors 114 and 118 are about 3V each during the ESD zap 210. As such, the clamped voltage at the common port 102 may be about 30V.

As shown in FIG. 12, at time T0, an ESD zap (e.g., the ESD zap 210) may begin, and the drain voltage $V_D$ 1210 of the transistor 114 whose gate is directly connected to the common port 102 may be at about 30V. Because the ESD protection circuitry 1110 floats or decouples the gates of the transistors 114 from the driver circuitry 122 during the ESD zap, the gate voltage $V_G$ 1220 may follow the voltage rise in the drain voltage $V_D$ 1210 (and source voltage as well) as shown. Because the individual ESD protection circuitry 1110 floats or decouples the gates of the transistor 114 from the driver circuitry 122 during the ESD zap and the gates of the transistor 114 are not connected to each other as in FIG. 6, the gate voltage $V_G$ 1220 may not discharge (e.g., no charge sharing) as shown in FIG. 7. As shown, the gate voltage $V_G$ 1220 may remain relatively the same throughout the ESD duration. Accordingly, a small voltage 1202 (e.g., corresponding to $V_G$ D) may appear at the gate oxide, and thus the gate oxide stress may be relieved.

Comparing the graph 1200 to the graph 700 of FIG. 7, it can be seen that the gate oxide may experience a smaller voltage when using the RF switch circuitry 1100 with individual ESD protection circuitry for each transistor 114, 118 at the switch circuitry 110.

Figure 13:
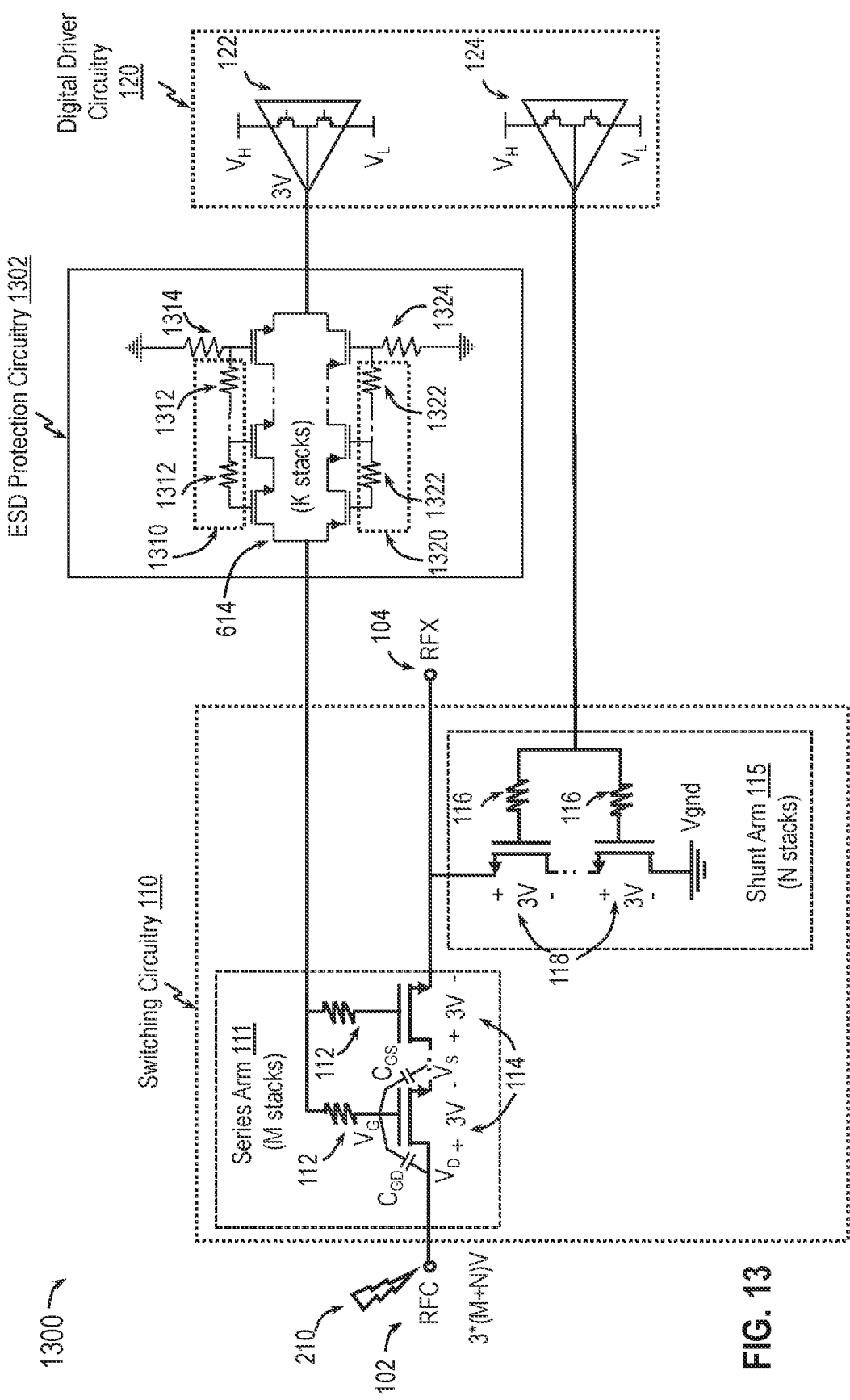
FIG. 13 is a schematic diagram illustrating an exemplary ESD-protected, high-power, fast-switching RF switch circuitry, according to embodiments of the present disclosure.

FIG. 13 is a schematic diagram illustrating an exemplary ESD-protected, high-power, fast-switching RF switch circuitry 1300, according to embodiments of the present disclosure. The RF switch circuitry 1300 of FIG. 13 shares many elements with the RF switch circuitry 800 of FIG. 8 and the same reference numerals as in FIG. 8 are used in FIG. 13 to refer to the same or analogous elements of FIG. 8; for brevity, a discussion of these elements is not repeated, and these elements may take the form of any of the embodiments disclosed herein.

As shown in FIG. 13, the RF switch circuitry 1300 may include ESD protection circuitry 1302 coupled between the gates of the transistors 114 in the series arm 111 of the switch circuitry 110 and the driver circuitry 122. The ESD protection circuitry 1302 may be substantially similar to the ESD protection circuitry 802 of FIG. 8. However, the gates of the pass gate transistors 614 are biased by a resistive ladder network 1310 including resistors 1312 connected in series, and the gates of the pass gate transistors 615 are biased by a resistive ladder network 1320 including resistors 1322 connected in series. More specifically, the gates of the transistors 614 are connected to each other via the resistors 1312 and the resistive ladder network 1310 is biased from a single feed path via a resistor 1314 (e.g., of a high resistance value such as 2 MΩ) coupled to ground. For instance, the gate of each of the transistors 614 is connected to the gate of an adjacent transistor 614 via one of the resistors 1312. Similarly, the gates of the transistors 615 are connected to each other via the resistors 1322 and the resistive ladder network 1320 is biased from a single feed path via the resistor 1324 coupled to ground. For instance, the gate of each of the transistors 615 is connected to the gate of an adjacent transistor 615 via one of the resistors 1322. Utilizing resistive ladder networks 1310 and 1320 to bias the pass gate transistors 614 and 615, respectively, can advantageously provide a more compact footprint for the RF switch circuitry 1300 compared to the RF switch circuitry 800 of FIG. 8.

Further, while not shown in FIG. 13, the RF switch circuitry 1300 may further include an ESD protection similar to the ESD protection circuitry 1302 coupled between the gates of the transistors 118 in the shunt arm 115 of the switch circuitry 110 and the driver circuitry 124 to provide ESD protection to the transistors 118. Further still, while FIG. 13 illustrates ladder biasing for the transistors 614 (NMOS devices) and 615 (PMOS devices) at the ESD protection circuitry 1302, the ladder biasing can be applied to the ESD protection circuitry 602 of FIG. 6, the ESD protection circuitry 902 of FIG. 9, and/or the ESD protection circuitry 1002 of FIG. 10.

Figure 14:
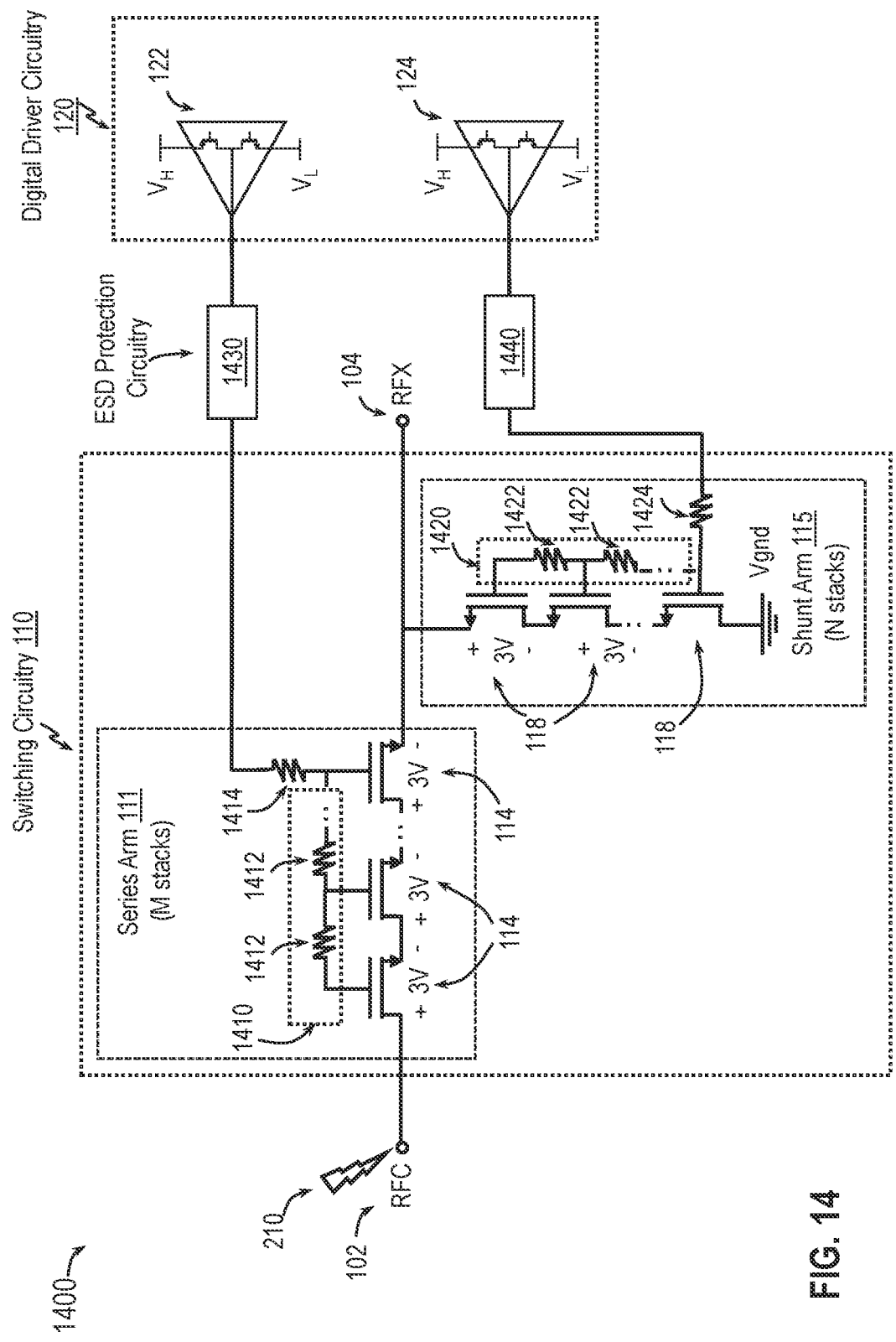
FIG. 14 is a schematic diagram illustrating an exemplary ESD-protected, high-power, fast-switching RF switch circuitry, according to embodiments of the present disclosure.

FIG. 14 is a schematic diagram illustrating an exemplary ESD-protected, high-power, fast-switching RF switch circuitry 1400, according to embodiments of the present disclosure. The RF switch circuitry 1400 of FIG. 14 shares many elements with the RF switch circuitry 400 of FIG. 4 and the same reference numerals as in FIG. 4 are used in FIG. 14 to refer to the same or analogous elements of FIG. 4; for brevity, a discussion of these elements is not repeated, and these elements may take the form of any of the embodiments disclosed herein.

As shown in FIG. 14, the RF switch circuitry 1400 may include switch circuitry 110 including a series arm 111 and a shunt arm 115. The series arm 111 may include transistors 114 arranged in a stacked configuration between the common port 102 and the terminal port 104 as shown in FIG. 4. However, the gates of the stacked transistors 114 are biased by a resistive ladder network 1410 including resistors 1412 connected in series. In a similar way, the shunt arm 115 may include transistors 118 arranged in a stacked configuration between the common port 102 and ground as shown in FIG. 4. However, the gates of the stacked transistors 118 are biased by a resistive ladder network 1420 including resistors 1422 connected in series. More specifically, the gates of the transistors 114 are connected to each other via the resistors 1412 and the resistive ladder network 1410 is biased from a single feed path via a resistor 1414 (e.g., about 10 kΩ for fast switching) coupled to driver circuitry 122. For instance, the gate of each of the transistors 114 is connected to the gate of an adjacent transistor 114 via one of the resistors 1412. Similarly, the gates of the transistors 118 are connected to each other via the resistors 1422 and the resistive ladder network 1420 is biased from a single feed path via a resistor 1424 (e.g., about 10 kΩ for fast switching) coupled to the driver circuitry 124. For instance, the gate of each of the transistors 118 is connected to the gate of an adjacent transistor 118 via one of the resistors 1422. Utilizing resistive ladder networks 1410 and 1420 to bias the transistors 114 and 118, respectively, can advantageously provide a more compact footprint for the RF switch circuitry 1400 compared to the RF switch circuitry 600 of FIG. 6.

As further shown in FIG. 14, the RF switch circuitry 1400 may include ESD protection circuitries 1430 and 1440. The ESD protection circuitry 1430 may be coupled between the gates of the transistors 114 and the driver circuitry 122 via the resistor 1414 and the resistive ladder network 1410. The ESD protection circuitry 1440 may be coupled between the gates of the transistors 114 and the driver circuitry 122 via the resistor 1414 and the resistive ladder network 1410. Each of the ESD protection circuitries 1430 or 1440 may pass or electrically couple a control voltage from a respective driver circuitry 122 or 124 to the gate of a respective transistor 114 or 118 during normal operation and may electrically decouple or float the gate of the respective transistor 114 or 118 from the respective driver circuitry 122 or 124 during an ESD event (e.g., the ESD zap 210) as discussed herein. The ESD protection circuitries 1430 and 1440 may be implemented in any suitable ways, for example, using any suitable combination of the ESD protection circuitries 602, 802, 902, 1002, and/or 1302 discussed above with reference to FIGS. 6, 8, 9, 10, and/or 13, respectively.

While FIGS. 1-2, 4, 6, 8-11, and 12-14 illustrate the switch circuitry 110 including both the series arm 111 and the shunt arm 115, aspects are not limited thereto. For instance, the switch circuitry 110 can include the series arm 111 but not the shunt arm 115. Alternatively, the switch circuitry 110 can include the shunt arm 115 but not the series arm 111. Further, the series transistors 114 in the series arm 111 and/or the shunt transistors 118 in the shunt arm 115 may be biased using resistive ladder biasing network as shown in FIG. 14 or using a regular or non-ladder biasing network as shown in FIGS. 1-2, 4, 6, 8-11, and 12-13. Generally, the ESD protection circuitries (e.g., common and/or individual ESD protection circuitries) disclosed herein can be placed between some or all of the series transistors 114 and the shunt transistors 118. In general, an ESD protection circuitry may be implemented using any suitable combination of the ESD protection circuitries 410, 420, 602, 802, 902, 1002, 1110, 1120, 1302, and/or 1402 discussed above.

Figure 15:
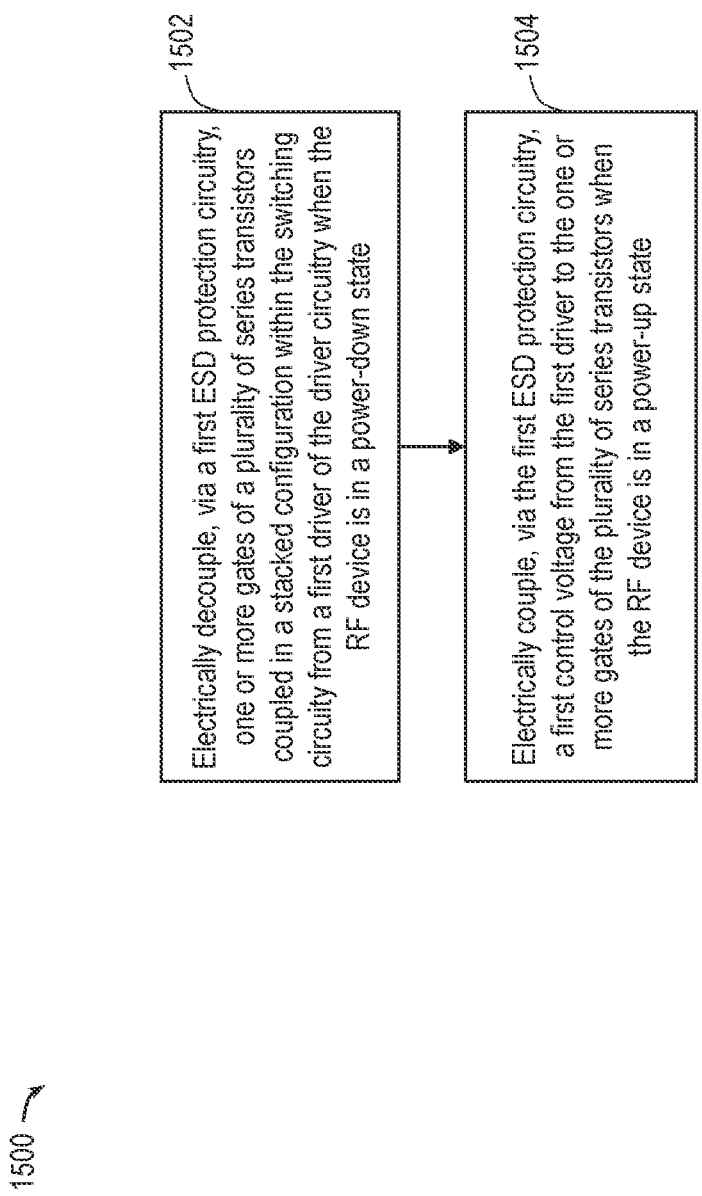
FIG. 15 is a flow diagram illustrating a method for providing ESD protection in an RF switch circuitry, according to some embodiments of the present disclosure.

Example Method for Providing ESD Protection in High-Power, Fast-Switching RF Switch Circuitry FIG. 15 is a flow diagram illustrating a method 1500 for providing ESD protection in RF switch device, according to some embodiments of the present disclosure. The method 1500 can be implemented by a receive signal chain including nonlinear circuitry. Although the operations of the method 1500 may be illustrated with reference to particular embodiments of the RF switch circuitry 400, 600, 800, 900, 1000, 1100, 1300, and/or 1400 disclosed herein, the method 1500 may be performed using any suitable hardware components and/or software components. The method 1500 may utilize similar mechanisms as discussed above with reference to FIGS. 1-2, 4, 6, 8-11, and 13-14. Operations are illustrated once each and in a particular order in FIG. 15, but the operations may be performed in parallel, reordered, and/or repeated as desired.

For instance, the RF switch device may include a common port, at least one terminal port, a switch circuitry between the common port and the terminal port, and driver circuitry to control the switch circuitry. The common port, terminal port, switch circuitry, and driver circuitry may correspond to the common port 102, terminal port 104, switch circuitry 110, and driver circuitry 120, respectively, discussed herein.

At 1502, one or more gates of a plurality of series transistors (e.g., the transistors 114) coupled in a stacked configuration within the switch circuitry may be electrically decouple, via a first ESD protection circuitry, from a first driver (e.g., the driver circuitry 122) of the driver circuitry when the RF device is in a power-down state. The first ESD protection circuitry may be similar to the ESD protection circuitries 410, 420, 602, 802, 902, 1002, 1110, 1120, and/or 1302 discussed herein.

At 1504, a first control voltage from the first driver may be electrically couple, via the first ESD protection circuitry, to the one or more gates of the plurality of series transistors when the RF device is in a power-up state.

In some aspects, the first ESD protection circuitry may be a common ESD protection circuitry for all of the plurality of series transistors in the switch circuitry. As part of electrically decoupling the one or more gates of the plurality of series transistors from the first driver at 1502, the method 1500 may include decoupling gates of all of the plurality of series transistors from the first driver.

In some aspects, the first ESD protection circuitry may include an individual ESD protection circuitry for each of at least a first transistor and a second transistor of the plurality of series transistors. As part of the electrically decoupling the one or more gates of the plurality of series transistors from the first driver at 1502, the method 1500 may include decoupling a gate of the first transistor via a first respective individual ESD protection circuitry, and decoupling a gate of the second transistor via a second respective individual ESD protection circuitry.

In some aspects, the method 1500 may further include electrically decoupling, via a second ESD protection circuitry separate from the first ESD protection circuitry, one or more gates of a plurality of shunt transistors (e.g., the transistors 118) coupled in a stacked configuration within the switch circuitry from a second driver (e.g., the driver circuitry 124) of the driver circuitry when the RF device is in the power-down state. Further, the method 1500 may include electrically coupling, via the second ESD protection circuitry, a second control voltage from the second driver to the one or more gates of the plurality of shunt transistors when the RF device is in the power-up state.

In some aspects, as part of electrically decoupling the one or more gates of the plurality of series transistors from the first driver at 1502, the method 1500 may include switching, in response to the ESD voltage, a plurality of pass gate transistors coupled in a stacked configuration within the first ESD protection circuitry from a conducting state to a non-conducting state. In some aspects, as part of electrically coupling the first control voltage from the first driver to the one or more gates of the plurality of series transistors at 1504, the method 1500 may include switching the plurality of pass gate transistors of the first ESD protection circuitry from the non-conducting state to the conducting state.

Examples

Example 1 includes an electrostatic discharge (ESD)-protected radio frequency (RF) switch circuitry, including a common port; at least one terminal port; a switch circuitry coupled between the common port and the at least one terminal port, where the switch circuitry includes one or more transistors connected in a stacked configuration; and a first ESD protection circuitry coupled between a gate of a first transistor of the one or more transistors and a driver circuitry for the first transistor.

In Example 2, the ESD-protected RF switch circuitry of Example 1 can optionally include where the first ESD protection circuitry during a ESD pulse duration, decouples the gate of the first transistor from the driver circuitry; and during a duration outside of the ESD pulse duration, couples a control voltage from the driver circuitry to the first transistor.

In Example 3, the ESD-protected RF switch circuitry of any one of Examples 1-2 can optionally include where the switch circuitry includes a series arm including the one or more transistors connected in the stacked configuration; and the first ESD protection circuitry is further coupled to each of the one or more transistors in the series arm.

In Example 4, the ESD-protected RF switch circuitry of any one of Examples 1-3 can optionally include where the switch circuitry includes a series arm including the one or more transistors connected in the stacked configuration; and the ESD-protected RF switch circuitry further includes a second ESD protection circuitry coupled between a gate of a second transistor of the one or more transistors in the series arm, the second ESD protection circuitry separate from the first ESD protection circuitry.

In Example 5, the ESD-protected RF switch circuitry of any one of Examples 1-4 can optionally include where the switch circuitry includes a shunt arm including the one or more transistors connected in the stacked configuration; and the first ESD protection circuitry is further coupled to each of the one or more transistors in the shunt arm.

In Example 6, the ESD-protected RF switch circuitry of any one of Examples 1-5 can optionally include where the switch circuitry includes a shunt arm including the one or more transistors connected in the stacked configuration; and the ESD-protected RF switch circuitry further includes a second ESD protection circuitry coupled between a gate of a second transistor of the one or more transistors in the shunt arm, the second ESD protection circuitry separate from the first ESD protection circuitry.

In Example 7, the ESD-protected RF switch circuitry of any one of Examples 1-6 can optionally include where the first ESD circuitry includes a plurality of transistors connected in a stacked configuration.

In Example 8, the ESD-protected RF switch circuitry of any one of Examples 1-7 can optionally include where the plurality of transistors connected in the stacked configuration within the first ESD circuitry includes at least one of p-channel metal-oxide semiconductor (PMOS), n-channel metal-oxide semiconductor (NMOS), or complementary metal-oxide semiconductor (CMOS) transistors.

In Example 9, the ESD-protected RF switch circuitry of any one of Examples 1-8 can optionally include where the first ESD protection circuitry further includes a resistor coupled to a gate of one of the plurality of transistors connected in the stacked configuration within the first ESD protection circuitry, and where a gate discharge time constant of the one of the plurality of transistors is longer than an ESD pulse duration.

In Example 10, the ESD-protected RF switch circuitry of any one of Examples 1-9 can optionally include where the first ESD protection circuitry further includes a resistor connected in parallel with the plurality of transistors.

Example 11 includes an electrostatic discharge (ESD)-protected radio frequency (RF) switch integrated circuit (IC) device, including a common port; at least one terminal port; a switch circuitry including a first plurality of stacked transistors coupled in a series arm between the common port and the at least one terminal port; a first driver circuitry coupled to the first plurality of stacked transistors; and a first ESD protection circuitry coupled between one or more gates of the first plurality of stacked transistors and the first driver circuitry, where the first ESD protection circuitry electrically decouples the one or more gates from the first driver circuitry responsive to an ESD pulse; and electrically couples a control voltage from the first driver circuitry to the one or more gates when no ESD pulse is present.

In Example 12, the ESD-protected RF switch IC device of Example 11 can optionally include where the first ESD protection circuitry is a common ESD protection circuitry coupled between the first driver circuitry and each gate of the first plurality of stacked transistors.

In Example 13, the ESD-protected RF switch IC device of any one of Examples 11-12 can optionally include where the first ESD protection circuitry includes a first individual ESD protection circuitry coupled between a gate of a first transistor of the first plurality of stacked transistors and the first driver circuitry; and a second individual ESD protection circuitry coupled between a gate of a second transistor of the first plurality of stacked transistors and the first driver circuitry, the second individual ESD protection circuitry separate from the first individual ESD protection circuitry.

In Example 14, the ESD-protected RF switch IC device of any one of Examples 11-13 can optionally include where the switch circuitry further includes a second plurality of stacked transistors in a shunt arm between the at least one terminal port and ground; and the ESD-protected RF switch device further includes a second driver circuitry coupled to the second plurality of stacked transistors; and a second ESD protection circuitry coupled between one or more gates of the second plurality of stacked transistors, the second ESD protection circuitry separate from the first ESD protection circuitry.

In Example 15, the ESD-protected RF switch IC device of any one of Examples 11-14 can optionally include where the first ESD protection circuitry includes at least one of a transistor, a diode, or a resistor.

In Example 16, the ESD-protected RF switch IC device of any one of Examples 11-15 can optionally include where the first ESD protection circuitry includes a plurality of stacked pass gate transistors, and where each of the plurality of stacked pass gate transistors transition from an on state to an off state responsive to the ESD pulse.

In Example 17, the ESD-protected RF switch IC device of any one of Examples 11-16 can optionally include where the gates of the plurality of stacked pass gate transistors in the first ESD protection circuitry are coupled to ground.

In Example 18, the ESD-protected RF switch IC device of any one of Examples 11-16 can optionally include where the gates of the plurality of stacked pass gate transistors in the first ESD protection circuitry are coupled to a voltage source.

In Example 19, the ESD-protected RF switch IC device of any one of Examples 11-18 can optionally include where the first ESD protection circuitry further includes a resistor connected between a source or a drain of a first pass gate transistor of the plurality of pass gate transistors and a source or a grain of a second pass gate transistor of the plurality of pass gate transistors.

In Example 20, the ESD-protected RF switch IC device of any one of Examples 11-19 can optionally include where a gate discharge time constant of an individual transistor of the first plurality of transistors is shorter than a duration of an ESD pulse.

In Example 21, the ESD-protected RF switch IC device of any one of Examples 11-20 can optionally include where the RF switching device is a silicon on insulator (SOI) device.

Example 22 includes a method for providing electrostatic discharge (ESD) protection in a radio frequency (RF) switch device including a common port, at least one terminal port, switch circuitry between the common port and the at least one terminal port, and a driver circuitry to control the switch circuitry, the method including electrically decoupling, via a first ESD protection circuitry, one or more gates of a plurality of series transistors coupled in a stacked configuration within the switch circuitry from a first driver of the driver circuitry when the RF device is in a power-down state; and electrically coupling, via the first ESD protection circuitry, a first control voltage from the first driver to the one or more gates of the plurality of series transistors when the RF device is in a power-up state.

In Example 23, the method of Example 22 can optionally include the first ESD protection circuitry is common ESD protection circuitry for all of the plurality of series transistors in the switch circuitry; and the electrically decoupling the one or more gates of the plurality of series transistors from the first driver includes decoupling gates of all of the plurality of series transistors from the first driver.

In Example 24, the method of any one of Examples 22-23 can optionally include where the first ESD protection circuitry includes an individual ESD protection circuitry for each of at least a first transistor and a second transistor of the plurality of series transistors; and the electrically decoupling the one or more gates of the plurality of series transistors from the first driver includes decoupling a gate of the first transistor via a first respective individual ESD protection circuitry; and decoupling a gate of the second transistor via a second respective individual ESD protection circuitry.

In Example 25, the method of any one of Examples 22-24 can optionally include electrically decoupling, via a second ESD protection circuitry separate from the first ESD protection circuitry, one or more gates of a plurality of shunt transistors coupled in a stacked configuration within the switch circuitry from a second driver of the driver circuitry when the RF device is in the power-down state; and electrically coupling, via the second ESD protection circuitry, a second control voltage from the second driver to the one or more gates of the plurality of shunt transistors when the RF device is in the power-up state.

In Example 26, the method of any one of Examples 22-25 can optionally include where the electrically decoupling the one or more gates of the plurality of series transistors from the first driver includes switching, in response to the ESD voltage, a plurality of pass gate transistors coupled in a stacked configuration within the first ESD protection circuitry from a conducting state to a non-conducting state.

In Example 27, the method of any one of Examples 22-26 can optionally include where the electrically coupling the first control voltage from the first driver to the one or more gates of the plurality of series transistors includes switching the plurality of pass gate transistors of the first ESD protection circuitry from the non-conducting state to the conducting state.

Variations and Implementations

While embodiments of the present disclosure were described above with references to exemplary implementations as shown in FIGS. 1-15, a person skilled in the art will realize that the various teachings described above are applicable to a large variety of other implementations.

In certain contexts, the features discussed herein can be applicable to automotive systems, safety-critical industrial applications, medical systems, scientific instrumentation, wireless and wired communications, radio, radar, industrial process control, audio and video equipment, current sensing, instrumentation (which can be highly precise), and other digital-processing-based systems.

In the discussions of the embodiments above, components of a system, such as switch circuitries, transistors, resistors, voltage sources, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to ESD-protected high-power, fast-switching RF switch circuitries (or devices), in various communication systems.

Parts of various systems for implementing ESD-protected high-power, fast-switching RF switch circuitries (or devices) as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present figures may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present figures may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

It is also imperative to note that all of the specifications, dimensions, and relationships outlined herein (e.g., the number of components of the apparatuses and/or RF device shown in FIGS. 1-2, 4, 6, 8-11, 13-14) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present figures may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. Also, as used herein, the terms "substantially," "approximately," "about," etc., may be used to generally refer to being within +/−20% of a target value, e.g., within +/−10% of a target value, based on the context of a particular value as described herein or as known in the art.

Numerous other changes, substitutions, variations, alterations, and modifications may be ascertained to one skilled in the art and it is intended that the present disclosure encompass all such changes, substitutions, variations, alterations, and modifications as falling within the scope of the examples and appended claims. Note that all optional features of the apparatus described above may also be implemented with respect to the method or process described herein and specifics in the examples may be used anywhere in one or more embodiments.

The invention claimed is:

1. An electrostatic discharge (ESD)-protected radio frequency (RF) switch circuitry, comprising:
    a common port;
    at least one terminal port;
    a switch circuitry coupled between the common port and the at least one terminal port, wherein the switch circuitry comprises one or more transistors connected in a stacked configuration; and
    a first ESD protection circuitry coupled between a gate of a first transistor of the one or more transistors and a driver circuitry for the first transistor, wherein the first ESD protection circuitry:
        operates as an open circuit to electrically decouple the gate of the first transistor from the driver circuitry in response to an ESD pulse; and
        electrically couples a control voltage from the driver circuitry to the gate of the first transistor outside of a time duration associated with the ESD pulse.

2. The ESD-protected RF switch circuitry of claim 1, wherein:
    the switch circuitry comprises a series arm including the one or more transistors connected in the stacked configuration; and
    the first ESD protection circuitry is further coupled to each of the one or more transistors in the series arm.

3. The ESD-protected RF switch circuitry of claim 1, wherein:
the switch circuitry comprises a series arm including the one or more transistors connected in the stacked configuration; and
the ESD-protected RF switch circuitry further comprises a second ESD protection circuitry coupled between a gate of a second transistor of the one or more transistors in the series arm, the second ESD protection circuitry separate from the first ESD protection circuitry.

4. The ESD-protected RF switch circuitry of claim 1, wherein:
the switch circuitry comprises a shunt arm including the one or more transistors connected in the stacked configuration; and
the first ESD protection circuitry is further coupled to each of the one or more transistors in the shunt arm.

5. The ESD-protected RF switch circuitry of claim 1, wherein:
the switch circuitry comprises a shunt arm including the one or more transistors connected in the stacked configuration; and
the ESD-protected RF switch circuitry further comprises a second ESD protection circuitry coupled between a gate of a second transistor of the one or more transistors in the shunt arm, the second ESD protection circuitry separate from the first ESD protection circuitry.

6. The ESD-protected RF switch circuitry of claim 1, wherein the first ESD protection circuitry comprises a plurality of transistors connected in the stacked configuration.

7. The ESD-protected RF switch circuitry of claim 6, wherein the plurality of transistors connected in the stacked configuration within the first ESD protection circuitry comprises at least one of p-channel metal-oxide semiconductor (PMOS), n-channel metal-oxide semiconductor (NMOS), or complementary metal-oxide semiconductor (CMOS) transistors.

8. The ESD-protected RF switch circuitry of claim 6, wherein the first ESD protection circuitry further comprises a resistor coupled to a gate of one of the plurality of transistors connected in the stacked configuration within the first ESD protection circuitry, and wherein a gate discharge time constant of the one of the plurality of transistors is longer than an ESD pulse duration.

9. The ESD-protected RF switch circuitry of claim 6, further comprising:
a resistor connected in parallel with the plurality of transistors of the first ESD protection circuitry.

10. The ESD-protected RF switch circuitry of claim 1, further comprising a resistor coupled in series between the first ESD protection circuitry and the gate of the first transistor.

11. The ESD-protected RF switch circuitry of claim 1, wherein the first ESD protection circuitry electrically couples the control voltage from the driver circuitry to the gate of the first transistor except during time durations associated with ESD events.

12. An electrostatic discharge (ESD)-protected radio frequency (RF) switch integrated circuit (IC) device, comprising:
a common port;
at least one terminal port;
a switch circuitry comprising;
a first plurality of stacked transistors coupled in a series arm between the common port and the at least one terminal port; and
a second plurality of stacked transistors coupled in a shunt arm between the common port and ground;
a first driver circuitry coupled to the first plurality of stacked transistors;
a second driver circuitry coupled to the second plurality of stacked transistors;
a first ESD protection circuitry coupled between one or more gates of the first plurality of stacked transistors and the first driver circuitry; and
a second ESD protection circuitry coupled between one or more gates of the second plurality of stacked transistors, the second ESD protection circuitry separate from the first ESD protection circuitry.

13. The ESD-protected RF switch IC device of claim 12, wherein the first ESD protection circuitry is a common ESD protection circuitry coupled between the first driver circuitry and each gate of the first plurality of stacked transistors.

14. The ESD-protected RF switch IC device of claim 12, wherein the first ESD protection circuitry comprises:
a first individual ESD protection circuitry coupled between a gate of a first transistor of the first plurality of stacked transistors and the first driver circuitry; and
a second individual ESD protection circuitry coupled between a gate of a second transistor of the first plurality of stacked transistors and the first driver circuitry, the second individual ESD protection circuitry separate from the first individual ESD protection circuitry.

15. The ESD-protected RF switch IC device of claim 12, wherein the first ESD protection circuitry:
operates as an open circuit to electrically decouple the one or more gates from the first driver circuitry responsive to an ESD pulse; and
electrically couples a control voltage from the first driver circuitry to the one or more gates when no ESD pulse is present.

16. The ESD-protected RF switch IC device of claim 15, wherein the first ESD protection circuitry comprises a plurality of stacked pass gate transistors, and wherein each of the plurality of stacked pass gate transistors transition from an on state to an off state responsive to the ESD pulse.

17. The ESD-protected RF switch IC device of claim 12, wherein the first ESD protection circuitry comprises at least one of a transistor, a diode, or a resistor.

18. The ESD-protected RF switch IC device of claim 12, wherein a gate discharge time constant of an individual transistor of the first plurality of stacked transistors is shorter than a duration of an ESD pulse.

19. A method for providing electrostatic discharge (ESD) protection in a radio frequency (RF) switch device comprising a common port, at least one terminal port, switch circuitry between the common port and the at least one terminal port, and a driver circuitry to control the switch circuitry, the method comprising:
electrically decoupling, via a first ESD protection circuitry, one or more gates of a plurality of series transistors coupled in a stacked configuration within the switch circuitry from a first driver of the driver circuitry when the RF device is in a power-down state;
electrically coupling, via the first ESD protection circuitry, a first control voltage from the first driver to the one or more gates of the plurality of series transistors when the RF device is in a power-up state;
electrically decoupling, via a second ESD protection circuitry separate from the first ESD protection circuitry, one or more gates of a plurality of shunt transistors coupled in a stacked configuration within the switch circuitry from a second driver of the driver circuitry when the RF device is in the power-down state; and electrically coupling, via the second ESD protection circuitry, a second control voltage from the second driver to the one or more gates of the plurality of shunt transistors when the RF device is in the power-up state.

20. The method of claim 19, wherein:

the electrically decoupling the one or more gates of the plurality of series transistors from the first driver comprises:

switching a plurality of pass gate transistors coupled in a stacked configuration within the first ESD protection circuitry from a conducting state to a non-conducting state; and the electrically coupling the first control voltage from the first driver to the one or more gates of the plurality of series transistors comprises:

switching the plurality of pass gate transistors of the first ESD protection circuitry from the non-conducting state to the conducting state.

* * * * *